United States Patent
Kohno et al.

(10) Patent No.: US 8,318,614 B2
(45) Date of Patent: Nov. 27, 2012

(54) METHOD FOR FORMING SILICON NITRIDE FILM, METHOD FOR MANUFACTURING NONVOLATILE SEMICONDUCTOR MEMORY DEVICE, NONVOLATILE SEMICONDUCTOR MEMORY DEVICE AND PLASMA APPARATUS

(75) Inventors: Masayuki Kohno, Amagasaki (JP); Tatsuo Nishita, Amagasaki (JP); Toshio Nakanishi, Amagasaki (JP); Yoshihiro Hirota, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 330 days.

(21) Appl. No.: 12/532,743

(22) PCT Filed: Mar. 25, 2008

(86) PCT No.: PCT/JP2008/055569
§ 371 (c)(1),
(2), (4) Date: Sep. 23, 2009

(87) PCT Pub. No.: WO2008/117798
PCT Pub. Date: Oct. 2, 2008

(65) Prior Publication Data
US 2010/0052040 A1    Mar. 4, 2010

(30) Foreign Application Priority Data

Mar. 26, 2007  (JP) ................................ 2007-079851
Sep. 28, 2007  (JP) ................................ 2007-254272

(51) Int. Cl.
*H01L 21/26* (2006.01)

(52) U.S. Cl. ................ 438/792; 257/325; 257/E21.293; 118/723 AN

(58) Field of Classification Search .................. 438/792; 257/325; 118/723 AN
See application file for complete search history.

(56) References Cited

U.S. PATENT DOCUMENTS 6,399,520 B1 *   6/2002   Kawakami et al. ........... 438/792
7,002,295 B2 *   2/2006   Kojima et al. ................ 313/582

FOREIGN PATENT DOCUMENTS

| JP | 3-9571 | 1/1991 |
|----|--------|--------|
| JP | 5-145078 | 6/1993 |
| JP | 2002-217317 | 8/2002 |
| JP | 2004-247581 | 9/2004 |
| JP | 2005-354041 | 12/2005 |
| JP | 2006-196643 | 7/2006 |
| WO | 2005/109483 | 11/2005 |

OTHER PUBLICATIONS

International Search Report mailed on May 1, 2008.
U.S. National Phase of PCT/JP2008/055679 by Miyazaki et al. filed on Sep. 23, 2009.

* cited by examiner

*Primary Examiner* — Chandra Chaudhari
(74) *Attorney, Agent, or Firm* — Smith, Gambrell & Russell, LLP

(57) ABSTRACT

A Plasma processing apparatus (100) introduces microwaves into a chamber (1) by a plane antenna (31) which has a plurality of holes. A material gas, which contains a nitrogen-containing compound and a silicon-containing compound, is introduced into the chamber (1) by using the plasma processing apparatus, and plasma is generated by the microwaves. Then, a silicon nitride film is deposited by the plasma on a surface of an object to be processed. The trap density of the silicon nitride film is controlled by adjusting the conditions of the plasma CVD process.

14 Claims, 13 Drawing Sheets

METHOD FOR FORMING SILICON NITRIDE FILM, METHOD FOR MANUFACTURING NONVOLATILE SEMICONDUCTOR MEMORY DEVICE, NONVOLATILE SEMICONDUCTOR MEMORY DEVICE AND PLASMA APPARATUS

TECHNICAL FIELD

The present invention relates to a method for forming, by plasma CVD (chemical vapor deposition), a silicon nitride film which is useful as a charge storage layer of a nonvolatile semiconductor memory device, and also relates to a method for manufacturing a nonvolatile semiconductor memory device and to a nonvolatile semiconductor memory device, both using the silicon nitride-film forming method.

BACKGROUND ART

Current nonvolatile semiconductor memory devices, as typified by electrically rewritable EEPROM (electrically erasable and programmable ROM), include those having a laminate structure, called SONOS (silicon-oxide-nitride-oxide-silicon) type or MONOS (metal-oxide-nitride-oxide-silicon) type. In these types of nonvolatile semiconductor memory devices, holding of information is performed with a silicon nitride film (nitride), sandwiched between silicon dioxide films (oxide), as a charge storage layer. In particular, in such a nonvolatile semiconductor memory device, by applying a voltage between a semiconductor substrate (silicon) and a control gate electrode (silicon or metal), electrons are injected into a silicon nitride film as a charge storage layer to store data, or electrons stored in the silicon nitride film are removed to erase data. Rewriting of data is thus performed.

As a technique for forming a silicon nitride film as a charge storage layer of a nonvolatile semiconductor memory device, Japanese Patent Laid-Open Publication No. 5-145078 (patent document 1) describes a method for forming a silicon nitride film between a tunnel oxide film and a top oxide film by a reduced pressure CVD method using dichlorosilane ($SiH_2Cl_2$) and ammonia ($NH_3$) as source gases, carried out at the flow rate ratio $SiH_2Cl_2/NH_3$ of not more than 1/10.

With the recent higher integration of semiconductor devices, the device structures of nonvolatile semiconductor memory devices are becoming increasingly miniaturized. To miniaturize a nonvolatile semiconductor memory device, it is necessary to enhance the charge storage capacity of a silicon nitride film as a charge storage layer in the memory device, thereby enhancing the data storage capacity. The charge storage capacity of a silicon nitride film is related to the density of traps, which serve as a charge capture center, in the film. The use of a silicon nitride film having a large trap density as a charge storage layer is therefore considered effective as a means for enhancing the data storage capacity of a nonvolatile semiconductor memory device.

However, it is technically difficult with a conventional reduced CVD or thermal CVD film forming method to control the trap density of a silicon nitride film in the course of the formation of the film; and the formation of a silicon nitride film having a desired trap density has not been attained as yet. For example, it is not possible with the above-described silicon nitride film-forming method disclosed in the patent document 1 to directly control the trap density of a silicon nitride film. Therefore, in order to increase the trap density at the interface between the silicon nitride film and a top oxide film, an intermediate transition layer containing a large amount of Si is provided between the two films. Further, the method of the patent document 1 employs a technique to control the timings of supply of source gases in a complicated manner. In particular, according to the technique disclosed in the patent document 1, when terminating the formation of a silicon nitride film, the supply of ammonia is first stopped and, after the remaining ammonia is consumed, the supply of dichlorosilane is stopped. When later forming a top oxide film, only nitrous oxide is first supplied and, after the elapse of a predetermined period of time, silane is supplied to initiate deposition of the top oxide film.

However, when such a method of controlling the timings of supply of source gases as described in the patent document 1 is employed, a slight timing difference will cause a large change in the quality of the resulting film. Therefore, it appears totally impossible to form a silicon nitride film having a desired trap density with good reproducibility by such a film forming method.

DISCLOSURE OF THE INVENTION

It is therefore an object of the present invention to provide a silicon nitride film-forming method which can control the trap density of a silicon nitride film to be formed at a desired value.

It is another object of the present invention to provide a nonvolatile semiconductor memory device which is provided with a silicon nitride film having a controlled charge storage capacity and which has an excellent data storage capacity.

According to a first aspect of the present invention, there is provided a method for forming a silicon nitride film by turning a source gas containing a nitrogen-containing compound and a silicon-containing compound into a plasma by means of microwaves, and depositing a silicon nitride film on a substrate by plasma CVD using the plasma, said method comprising: setting a substrate in a processing chamber of a plasma processing apparatus in which microwaves are introduced into the processing chamber by using a plane antenna having a plurality of holes; and depositing a silicon nitride film on the substrate while controlling plasma CVD conditions in the plasma processing apparatus so that the trap density of the deposited silicon nitride film is controlled at a predetermined value.

In the first aspect, the silicon nitride film may be formed by using ammonia ($NH_3$) as the nitrogen-containing compound and disilane ($Si_2H_6$) as the silicon-containing compound, and carrying out plasma CVD under such conditions as to generate the plasma at a processing pressure in the range of 1 Pa to 1333 Pa. In this case, the flow rate ratio between the ammonia ($NH_3$) and the disilane ($Si_2H_6$) ($NH_3$ flow rate/$Si_2H_6$ flow rate) in the source gas may be in the range of 0.1 to 1000. Further, the trap density of the silicon nitride film may be made to be distributed in the range of $1\times10^{17}$ to $5\times10^{17}$ $cm^{-3}$ $eV^{-1}$ in the thickness direction of the film. In this case, the thickness of the silicon nitride film is preferably in the range of 1 to 20 nm.

Alternatively, in the first aspect, the silicon nitride film may be formed by using nitrogen ($N_2$) as the nitrogen-containing compound and disilane ($Si_2H_6$) as the silicon-containing compound, and carrying out plasma CVD under such conditions as to generate the plasma at a processing pressure in the range of 0.1 Pa to 500 Pa. In this case, the flow rate ratio between the nitrogen ($N_2$) and the disilane ($Si_2H_6$) ($N_2$ flow rate/$Si_2H_6$ flow rate) in the source gas may be in the range of 0.1 to 5000.

Further in the first aspect, the processing temperature may be in the range of 300° C. to 600° C.

According to a second aspect of the present invention, there is provided a method for forming a silicon nitride film by turning a source gas containing a nitrogen-containing compound and a silicon-containing compound into a plasma by means of microwaves, and depositing a silicon nitride film on a substrate by plasma CVD using the plasma, said method comprising: setting a substrate in a processing chamber of a plasma processing apparatus in which microwaves are introduced into the processing chamber by using a plane antenna having a plurality of holes; depositing a first silicon nitride film having a first trap density on the surface of the substrate by plasma CVD under first conditions; and depositing a second silicon nitride film having a second trap density, which differs from the first trap density, on the first silicon nitride film by plasma CVD under second conditions which differ from the first conditions.

In the second aspect, the first silicon nitride film may be formed by using ammonia ($NH_3$) as the nitrogen-containing compound and disilane ($Si_2H_6$) as the silicon-containing compound, and generating the plasma at a processing pressure in the range of 1 Pa to 1333 Pa, and the second silicon nitride film may be formed by using nitrogen ($N_2$) as the nitrogen-containing compound and disilane ($Si_2H_6$) as the silicon-containing compound, and generating the plasma at a processing pressure in the range of 0.1 Pa to 500 Pa. The trap density of at least one of the first silicon nitride film and the second silicon nitride film may be made to be distributed in the range of $1\times10^{17}$ to $5\times10^{17}$ $cm^{-3}$ $eV^{-1}$ in the thickness direction of the film. In this case, the thickness of at least one of the first silicon nitride film and the second silicon nitride film is preferably in the range of 1 to 20 nm. The deposition of the first silicon nitride film and the deposition of the second silicon nitride film may be carried out alternately.

According to a third aspect of the present invention, there is provided a method for manufacturing a nonvolatile semiconductor memory device, comprising: forming a laminate of a plurality of insulating films, including a silicon nitride film as a charge storage layer having a charge storage capacity, on a channel region of a semiconductor substrate; and forming a gate electrode on the laminate, wherein the silicon nitride film is formed by a deposition method of turning a source gas containing a nitrogen-containing compound and a silicon-containing compound into a plasma by means of microwaves, and depositing the silicon nitride film on the semiconductor substrate by plasma CVD using the plasma, the deposition method comprising: setting the semiconductor substrate in a processing chamber of a plasma processing apparatus in which microwaves are introduced into the processing chamber by using a plane antenna having a plurality of holes; and depositing a silicon nitride film on the semiconductor substrate while controlling plasma CVD conditions in the plasma processing apparatus so that the trap density of the deposited silicon nitride film is controlled at a predetermined value.

According to a fourth aspect of the present invention, there is provided a nonvolatile semiconductor memory device comprising: a semiconductor substrate having a channel region in the main surface; a laminate of a plurality of insulating films, including a silicon nitride film as a charge storage layer having a charge storage capacity, formed on the channel region; and a gate electrode formed on the laminate, wherein the silicon nitride film is formed by a deposition method of turning a source gas containing a nitrogen-containing compound and a silicon-containing compound into a plasma by means of microwaves, and depositing the silicon nitride film on the semiconductor substrate by plasma CVD using the plasma, the deposition method comprising: setting the semiconductor substrate in a processing chamber of a plasma processing apparatus in which microwaves are introduced into the processing chamber by using a plane antenna having a plurality of holes; and depositing a silicon nitride film on the semiconductor substrate while controlling plasma CVD conditions in the plasma processing apparatus so that the trap density of the deposited silicon nitride film is controlled at a predetermined value.

According to a fifth aspect of the present invention, there is provided a plasma processing apparatus comprising: a processing chamber for processing an object to be processed by using a plasma; a plane antenna, having a plurality of holes, through which microwaves are introduced into the processing chamber; a gas supply mechanism for supplying a source gas into the processing chamber; an exhaust mechanism for evacuating and depressurizing the processing chamber; a temperature adjustment mechanism for adjusting the temperature of the object to be processed; and a control section which, when turning a source gas containing a nitrogen-containing compound and a silicon-containing compound into a plasma by means of microwaves introduced through the plane antenna into the processing chamber, and depositing a silicon nitride film on the object to be processed by plasma CVD using the plasma, controls plasma CVD conditions in the plasma processing apparatus so that the trap density of the deposited silicon nitride film is controlled at a predetermined value.

The present inventors found that the trap density of a silicon nitride film to be formed can be controlled by using a plasma processing apparatus which introduces microwaves into a processing chamber by means of a plane antenna having a plurality of holes, and modifying plasma CVD film-forming conditions. According to the present invention, based on such finding, a silicon nitride film is deposited on a substrate while controlling plasma CVD conditions in the plasma processing apparatus so that the trap density of the deposited silicon nitride film is controlled at a predetermined value. This enables the formation of a silicon nitride film having a desired trap density. Such a silicon nitride film having a desired trap density can be used as an insulating film in the manufacturing of a variety of semiconductor devices. The use of the film especially as a charge storage layer of a nonvolatile semiconductor memory device can realize a nonvolatile semiconductor memory device having an excellent data storage capacity.

Further according to the present invention, by controlling plasma CVD conditions, a laminate of silicon nitride films having different trap densities can be formed. This enables wide band engineering in nonvolatile semiconductor memory devices, making it possible to manufacture a nonvolatile semiconductor memory device having an excellent data storage capacity. In addition, by thus forming a laminate of silicon nitride films having different trap densities, two or more layers of silicon nitride films having different trap densities can be formed in a chamber of a single plasma processing apparatus without exposure of the films to the air. This enables designing of an efficient process.

BEST MODE FOR CARRYING OUT THE INVENTION

Preferred embodiments of the present invention will now be described with reference to the drawings.

[First Embodiment]

Figure 1:
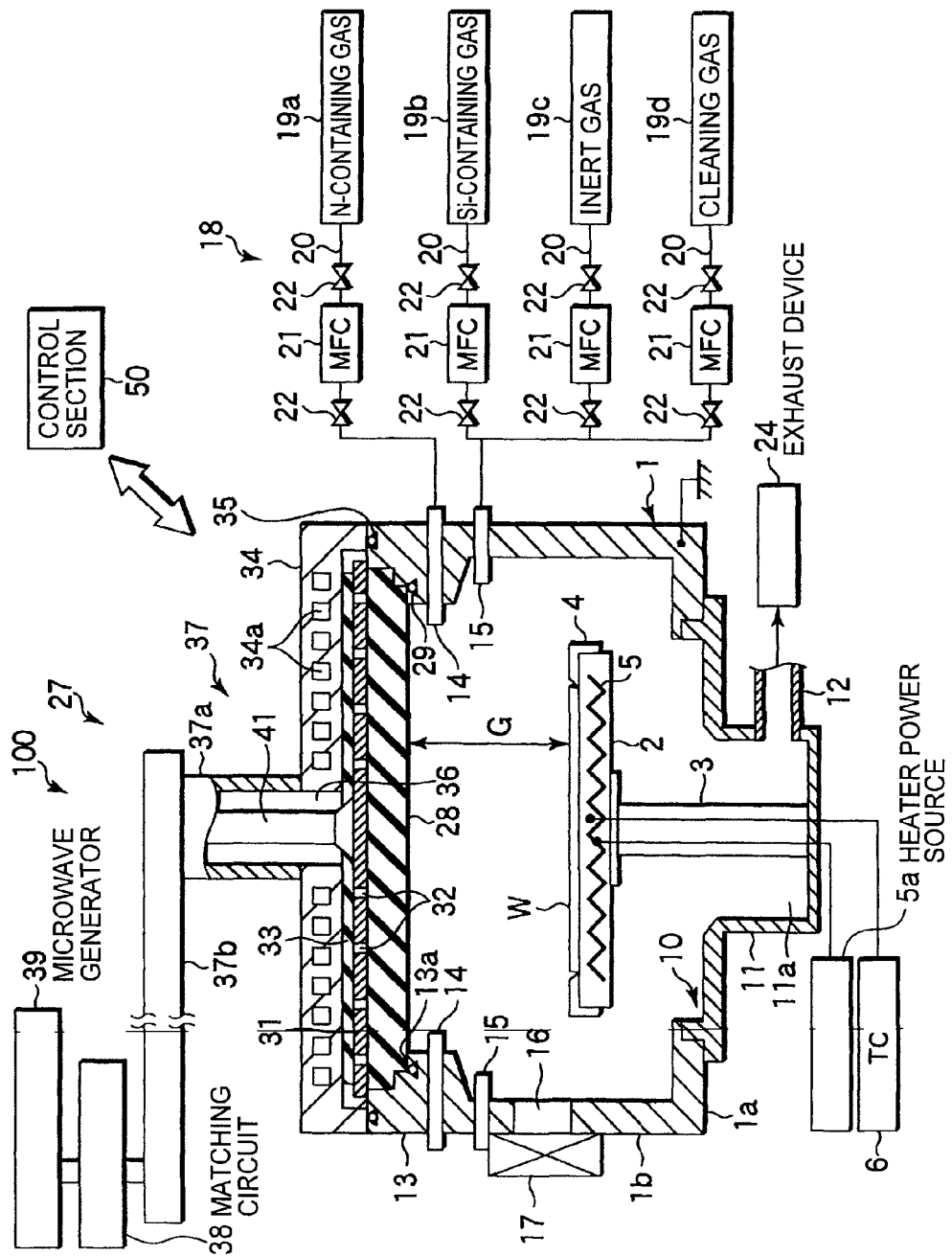
FIG. 1 is a cross-sectional diagram schematically illustrating the construction of an example of a plasma processing apparatus suited for carrying out a silicon nitride film-forming method according to the present invention.
Figure 2:
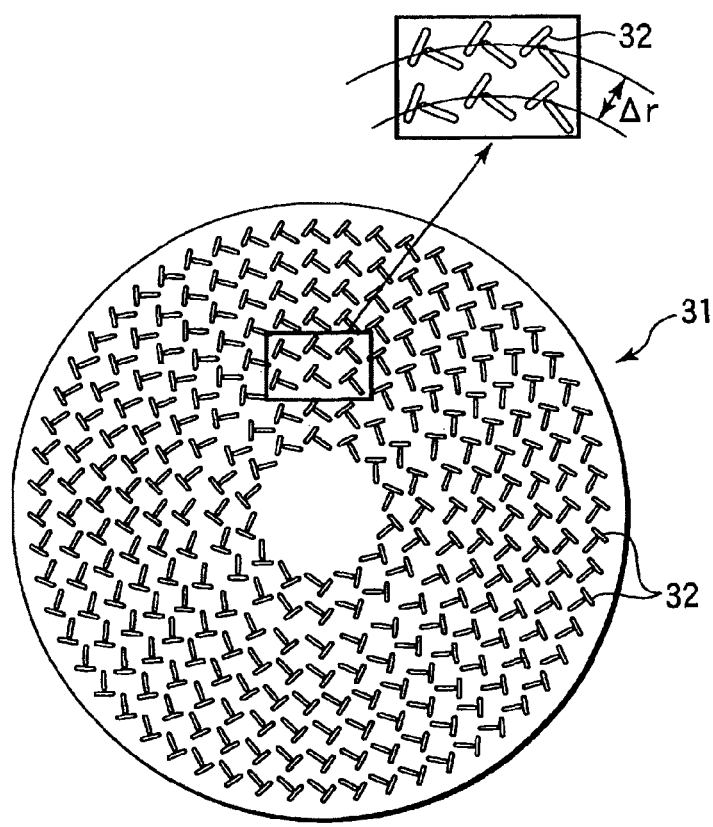
FIG. 2 is a plan view of the plane antenna of the plasma processing apparatus of FIG. 1.
Figure 3:
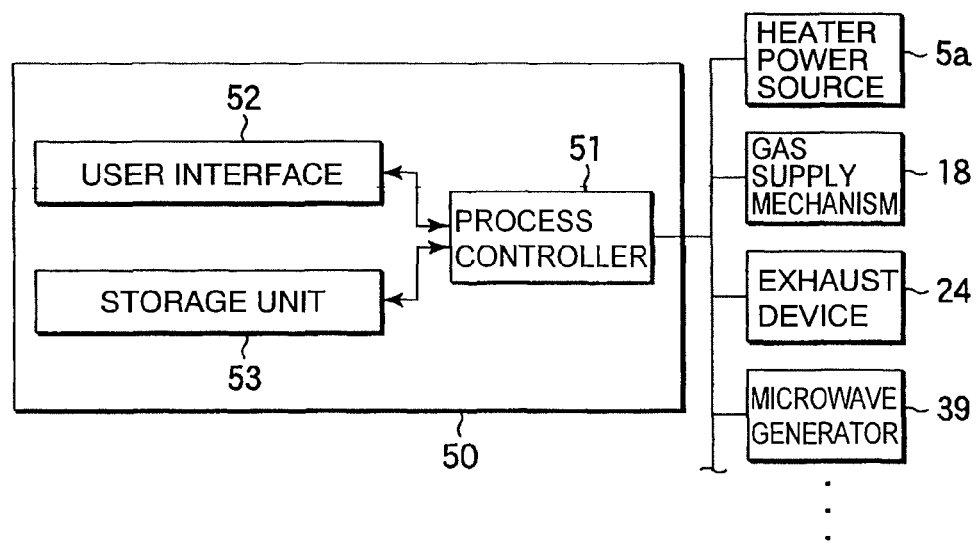
FIG. 3 is a block diagram illustrating the construction of the control section of the plasma processing apparatus of FIG. 1.

FIG. 1 is a cross-sectional diagram schematically illustrating the construction of an example of a plasma processing apparatus suited for carrying out a silicon nitride film-forming method according to the present invention; FIG. 2 is a plan view of the plane antenna of the plasma processing apparatus of FIG. 1; and FIG. 3 is a block diagram illustrating the construction of the control section of the plasma processing apparatus of FIG. 1.

The plasma processing apparatus 100 is constructed as an RLSA microwave plasma processing apparatus capable of generating a high-density, low-electron temperature, microwave-excited plasma by introducing microwaves into a processing chamber by means of an RLSA (radial line slot antenna), which is a plane antenna having a plurality of slot-like holes. The plasma processing apparatus 100 can perform processing with a plasma having a plasma density of $1 \times 10^{10}$ to $5 \times 10^{12}/cm^3$ and a low electron temperature of 0.7 to 2 eV. The plasma processing apparatus 100 can therefore be advantageously used for the formation of a silicon nitride film by plasma CVD in the manufacturing of a variety of semiconductor devices.

The plasma processing apparatus 100 mainly comprises an airtight chamber (processing chamber) 1, a gas supply mechanism 18 for supplying a gas into the chamber 1, an exhaust device 24 for evacuating and depressurizing the chamber 1, a microwave introduction mechanism 27, provided above the chamber 1, for introducing microwaves into the chamber 1, and a control section 50 for controlling these components of the plasma processing apparatus 100.

The chamber 1 is a grounded, generally-cylindrical container, and has a bottom wall 1a and a side wall 1b of e.g. aluminum. The chamber 1 may be a container of a rectangular cylinder shape.

In the chamber 1 is provided a worktable 2 for horizontally supporting a silicon wafer (hereinafter referred to simply as "wafer") W as a processing object. The worktable 2 is made of a ceramic material having high thermal conductivity, such as AlN. The worktable 2 is supported by a cylindrical support member 3 extending upwardly from the center of the bottom of an exhaust chamber 11. The support member 3 is also made of a ceramic material having high thermal conductivity, such as AlN.

The worktable 2 is provided with a cover ring 4 for covering a peripheral portion of the worktable 2 and guiding the wafer W. The cover ring 4 is an annular member made of e.g. quartz, AlN, $Al_2O_3$ or SiN.

A resistance heating-type heater 5 as a temperature adjustment mechanism is embedded in the worktable 2. The heater 5, when powered from a heater power source 5a, heats the worktable 2 and, by the heat, uniformly heats the wafer W as a processing substrate.

The worktable 2 is also provided with a thermocouple (TC) 6. Based on a temperature detected by the thermocouple 6, the wafer W can be controlled at a temperature e.g. in the range of room temperature to 900° C.

Further, the worktable 2 has wafer support pins (not shown) for raising and lowering the wafer W while supporting it. The wafer support pins are each projectable and retractable with respect to the surface of the worktable 2.

A circular opening 10 is formed generally centrally in the bottom wall 1a of the chamber 1. The bottom wall 1a is provided with a downwardly-projecting exhaust chamber 11 which communicates with the opening 10. An exhaust pipe 12 is connected to the exhaust chamber 11, and the exhaust chamber 11 is connected via the exhaust pipe 12 to the exhaust device 24.

An annular plate 13, which functions as a lid for opening and closing the chamber 1, is disposed on the upper end of the side wall 1b. The inner circumference of the plate 13, at its lower portion, projects inwardly (toward the inner space of the chamber), forming an annular support portion 13a.

The plate 13 is provided with an annular gas introduction section 14 as a first gas introduction section. Further, the side wall 1b of the chamber 1 is provided with an annular gas introduction section 15 as a second gas introduction section. The gas introduction sections 14 and 15 are thus provided in upper and lower two stages. Predetermined gases are supplied from the gas supply mechanism 18 to the gas introduction sections 14 and 15. The gas introduction sections 14 and 15 may have the shape of a nozzle or a shower head. It is also possible to construct the gas introduction section 14 and the gas introduction section 15 in a single shower head.

The side wall 1b of the chamber 1 is provided with a transfer port 16 for transferring the wafer W between the chamber 1 and a transfer chamber (not shown) adjacent to the plasma processing apparatus 100, and a gate valve 17 for opening and closing the transfer port 16.

The gas supply mechanism 18 has, for example, a nitrogen-containing gas (N-containing gas) supply source 19a, a silicon-containing gas (Si-containing gas) supply source 19b, an inert gas supply source 19c and a cleaning gas source 19d. The nitrogen-containing gas supply source 19a is connected to the upper gas introduction section 14. The silicon-containing gas supply source 19b, the inert gas supply source 19c and the cleaning gas source 19d are connected to the lower gas introduction section 15. The gas supply mechanism 18 may also have a not-shown gas supply source other than the above sources, for example, a purge gas supply source to be used for replacement of the atmosphere in the chamber.

Nitrogen gas ($N_2$), ammonia ($NH_3$), hydrazine derivatives such as MMH (monomethyl hydrazine), etc. can be used as a nitrogen-containing gas which is a film-forming source gas. Silane ($SiH_4$), disilane ($Si_2H_6$), TSA (trisilyl amine), etc. can be used as a silicon-containing gas which is the other film-forming source gas. Of these, disilane ($Si_2H_6$) is especially preferred. $N_2$ gas or a rare gas, for example, can be used as an inert gas. The rare gas is a plasma-exciting gas, and examples of usable rare gases include Ar gas, Kr gas, Xe gas and He gas.

$ClF_3$ gas, $NF_3$ gas, HCl gas, $Cl_2$ gas, etc. can be used as a cleaning gas. Of these, $NF_3$ gas is used in a plasma state.

A nitrogen-containing gas from the nitrogen-containing gas supply source 19a of the gas supply mechanism 18 passes through a gas line 20 and reaches the gas introduction section 14, and is introduced from the gas introduction section 14 into the chamber 1. On the other hand, a silicon-containing gas and an inert gas, respectively from the silicon-containing gas supply source 19b and the inert gas supply source 19c, each pass through a respective gas line 20 and reach the gas introduction section 15, and is introduced from the gas introduction section 15 into the chamber 1. The gas lines 20 connected to the respective gas supply sources are each provided with a mass flow controller 21 and on-off valves 22 located upstream and downstream of the controller 21. Such construction of the gas supply mechanism 18 enables switching of the gases supplied and control of the flow rate of each gas, etc. The plasma-exciting rare gas, such as Ar, is an optional gas and need not necessarily be supplied simultaneously with the film-forming source gases. In view of stable generation of plasma, however, the supply of the rare gas is preferred.

The exhaust device 24 includes a high-speed vacuum pump, such as a turbo-molecular pump. The exhaust device 24 is connected via the exhaust pipe 12 to the exhaust chamber 11 of the chamber 1. By the actuation of the exhaust device 24, the gas in the chamber 1 uniformly flows into the space 11a of the exhaust chamber 11, and is discharged from the space 11a through the exhaust pipe 12 to the outside. The chamber 1 can thus be quickly depressurized into e.g. 0.133 Pa.

The construction of the microwave introduction mechanism 27 will now be described. The microwave introduction mechanism 27 mainly comprises a transmission plate 28, a plane antenna 31, a retardation member 33, a cover 34, a waveguide 37 and a microwave generator 39.

The transmission plate 28, which permits permeation therethrough of microwaves, is supported on the annular support surface 13a provided in the inner circumference of the plate 13. The interface between the transmission plate 28 and the support surface 13a is hermetically sealed with a seal member 29, so that the chamber 1 is kept hermetic. The transmission plate 28 is composed of a dielectric material, for example, a ceramic material such as quartz, $Al_2O_3$, AlN, etc.

The plane antenna 31 has a disk-like shape and is provided over the transmission plate 28 such that it faces the worktable 2. The shape of the plane antenna 31 is not limited to a disc-like shape; for example, the antenna may be of a square plate-like shape. The plane antenna 13 is fixed to the upper end of the plate 13.

The plane antenna 31 is comprised of e.g. a copper plate, a nickel plate, a stainless steel plate or an aluminum plate, whose surface is plated with gold or silver. The plane antenna 31 has a plurality of slot-like microwave radiating holes 32 that radiate microwaves. The microwave radiating holes 32, which penetrate the plane antenna 31, are formed in a predetermined pattern.

Each microwave radiating hole 32 is a slot-like hole e.g. as shown in FIG. 2, and adjacent two microwave radiating holes 32 are paired e.g. in a letter "T" arrangement. The microwave radiating holes 32, comprised of such pairs in a predetermined arrangement (e.g. letter "T" arrangement), are arranged in concentric circles as a whole.

The length of the microwave radiating holes 32 and the spacing in their arrangement are determined depending on the wavelength (λg) of microwaves. For example, the microwave radiating holes 32 are arranged with a spacing of λg/4 to λg. In FIG. 2, the spacing between adjacent concentric lines of microwave radiating holes 32 is denoted by Δr. The microwave radiating holes 32 may have other shapes, such as a circular shape and an arch shape. The arrangement of the microwave radiating holes 32 is not limited to the concentric arrangement: the microwave radiating holes 32 may be arranged e.g. in a spiral or radial arrangement.

The retardation member 33, having a higher dielectric constant than vacuum, is provided on the upper surface of the plane antenna 31. The retardation member 33 is employed in consideration of the fact that the wavelength of microwaves becomes longer in vacuum. The retardation member 33 functions to shorten the wavelength of microwaves, thereby adjusting plasma.

The plane antenna 31 and the transmission plate 28, and the retardation member 33 and the plane antenna 31 may be in contact with or spaced apart from each other, though preferably be in contact with each other.

The cover 34, which is electrically conductive, has a waveguide function, and is made of a metal material such as aluminum, stainless steel or copper, is provided above the chamber 1 such that it covers the plane antenna 31 and the retardation member 33. The interface between the upper end of the plate 13 and the cover 34 is sealed with a seal member 35. A cooling water flow passage 34a is formed in the interior of the cover 34. The cover 34, the retardation member 33, the plane antenna 31 and the transmission plate 28 can be cooled by passing cooling water through the cooling water flow passage 34a. The cover 34 is grounded.

An opening 36 is formed in the center of the upper wall (ceiling portion) of the cover 34, and the waveguide 37 is connected to the opening 36. The other end of the waveguide 37 is connected via a matching circuit 38 to the microwave generator 39 that generates microwaves.

The waveguide 37 is comprised of a coaxial waveguide 37a having a circular cross-section and extending upward from the opening 36 of the cover 34, and a horizontally-extending rectangular waveguide 37b connected via a mode converter to the upper end of the coaxial waveguide 37a.

An inner conductor 41 extends centrally in the coaxial waveguide 37a. The inner conductor 41, at its lower end, is connected and secured to the center of the plane antenna 31. With such construction, microwaves are transmitted through the inner conductor 41 of the coaxial waveguide 37a to the flat waveguide, formed by the conductive cover 34 and the plane antenna 31, radially, efficiently and uniformly.

With the microwave introduction mechanism 27 thus constructed, microwaves generated in the microwave generator 39 are transmitted through the waveguide 37 to the plane antenna 31, and introduced through the transmission plate 28 into the chamber 1. An exemplary microwave frequency which is preferably usable is 2.45 GHz. Other frequencies such as 8.35 GHz and 1.98 GHz can also be used.

The respective components of the plasma processing apparatus 100 are connected to and controlled by the control section 50. As shown in FIG. 3, the control section 50 includes a process controller 51 provided with a CPU, and a user interface 52 and a storage unit 53, both connected to the process controller 51. The process controller 51 is a control means which comprehensively controls those components of the plasma processing apparatus 100 which are related to process conditions, such as pressure, temperature, gas flow rate, etc. (heater power source 5a, gas supply mechanism 18, exhaust device 24, microwave generator 39, etc.)

The user interface 52 includes a keyboard for a process manager to perform a command input operation, etc. in order to manage the plasma processing apparatus 100, a display which visualizes and displays the operating situation of the plasma processing apparatus 100, etc. In the storage unit 53 are stored a control program (software) for executing under control of the process controller 51 various processings to be carried out in the plasma processing apparatus 100, and a recipe in which data on processing conditions, etc. is recorded.

A desired processing in the plasma processing apparatus 100 is carried out under the control of the process controller 51 by calling up an arbitrary recipe from the storage unit 53 and causing the process controller 51 to execute the recipe, e.g. through the operation of the user interface 52 performed as necessary. With reference to the process control program and the recipe of processing condition data, etc., it is possible to use those stored on a computer-readable storage medium, such as CD-ROM, hard disk, flexible disk, flash memory, etc. or to transmit them from another device e.g. via a dedicated line as needed, and use them online.

The plasma processing apparatus 100 thus constructed enables plasma CVD to be carried out at a low temperature of not more than 800° C. without damage to an underlying base film, etc. Further, the plasma processing apparatus 100, because of excellent plasma uniformity, can attain process uniformity.

Figure 4:
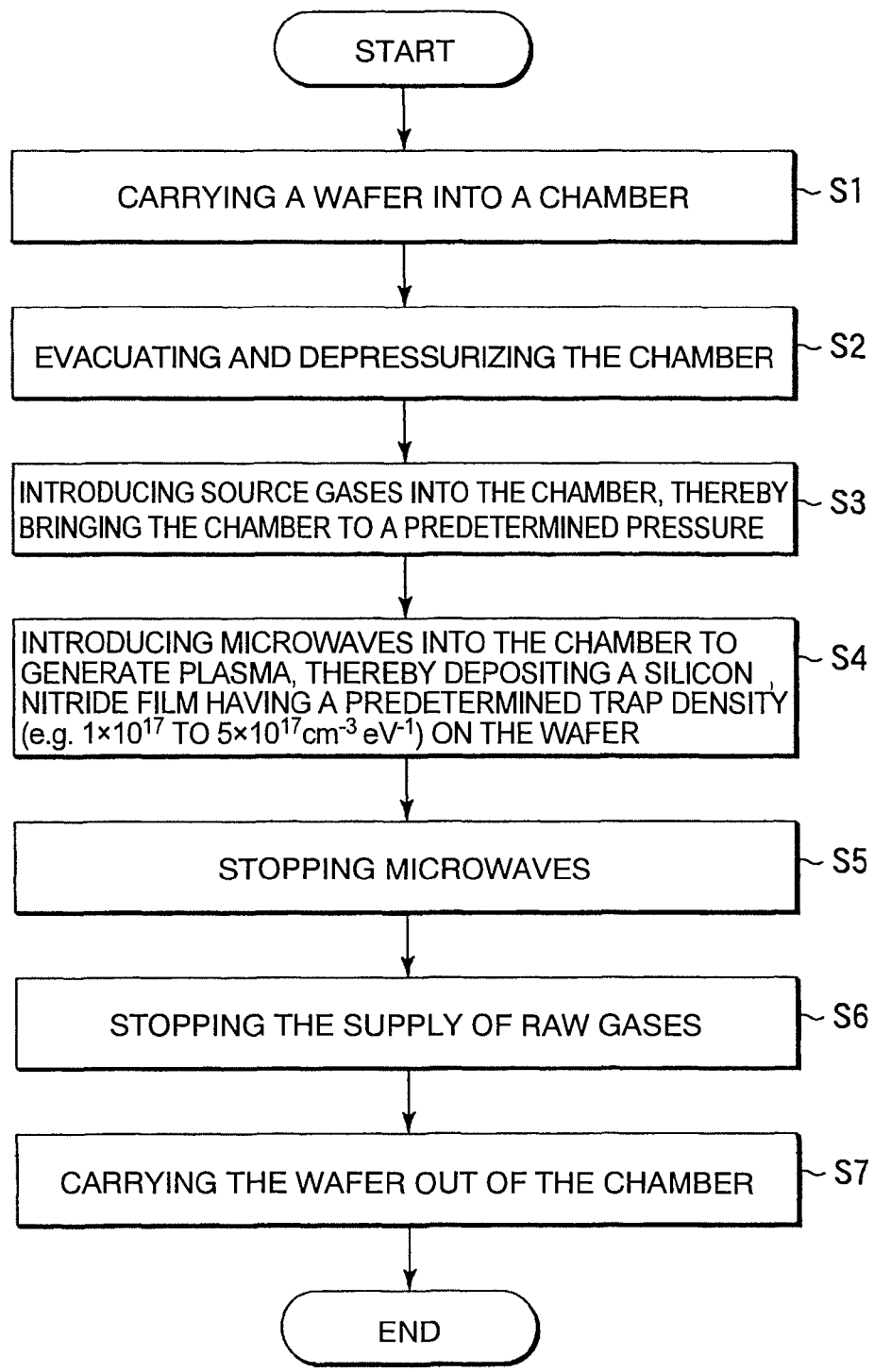
FIG. 4 is a flow chart illustrating a process of a silicon nitride film-forming method according to a first embodiment of the present invention.

In the RLSA plasma processing apparatus 100 thus constructed, the processing of depositing a silicon nitride film on the surface of a wafer W by plasma CVD is carried out e.g. by the process of the flow chart of FIG. 4.

First, the gate valve 17 is opened, and a wafer W is carried from the transfer port 16 into the chamber 1 and placed on the worktable 2 (step S1). Next, the chamber 1 is evacuated and depressurized (step S2). While evacuating and depressurizing the chamber 1, a nitrogen-containing gas and a silicon-containing gas are supplied from the nitrogen-containing gas supply source 19a and the silicon-containing gas supply source 19b of the gas supply mechanism 18 and introduced through the gas introduction sections 14, 15, respectively, into the chamber 1 respectively at a predetermined flow rate (step S3). In this manner the pressure in the chamber 1 is adjusted to a predetermined pressure.

Next, microwaves generated in the microwave generator 39, having a predetermined frequency, for example 2.45 GHz, are introduced via the matching circuit 38 into the waveguide 37 (step S4). The microwaves introduced into the waveguide 37 pass through the rectangular waveguide 37b and then through the coaxial waveguide 37a, and is supplied through the inner conductor 41 to the plane antenna 31. The microwaves are thus transmitted in the coaxial waveguide 37a toward the plane antenna 31. The microwaves are then radiated from the slot-like microwave radiating holes 32 of the plane antenna 31 through the transmission plate 28 into the space above the wafer W in the chamber 1. The output power of the microwaves is preferably such as to make the power density per unit area ($cm^2$) of the plane antenna 31 in the range of 0.41 to 4.19 W/$cm^2$. An arbitrary microwave output power that provides a power density in the above range can be selected e.g. from the range of 500 to 5000 W.

By the microwaves radiated from the plane antenna 31 into the chamber 1 via the transmission plate 28, an electromagnetic field is formed in the chamber 1, and the nitrogen-containing gas and the silicon-containing gas each turn into a plasma. Because the microwaves are radiated from the large number of microwave radiating holes 32 of the plane antenna 31, the microwave-excited plasma has a high density of about $1 \times 10^{10}$ to $5 \times 10^{12}$/$cm^3$ and, in the vicinity of the wafer W, has a low electron temperature of not more than about 1.5 eV. The microwave-excited high-density plasma thus formed causes little damage to a base film. Dissociation of the source gases progresses in the plasma and, by reaction of active species such as $Si_pH_q$, $SiH_q$, $NH_q$, N, etc. (p and q herein represent arbitrary numbers), a thin film of silicon nitride $Si_xN$ or silicon oxynitride $Si_xO_zN_y$ (x, y and z herein represent arbitrary numbers which are not necessarily determined stoichiometrically and vary depending on conditions), having a predetermined trap density, is deposited on the wafer W.

According to the present invention, the trap density of a silicon nitride film to be formed can be controlled at a desired value by selecting film-forming conditions in plasma CVD using the plasma processing apparatus 100.

For example, when forming a silicon nitride film e.g. having a low trap density (e.g. in the range of $5\times10^{10}$ to $5\times10^{12}$ $cm^{-2}$ $eV^{-1}$ in terms of surface density), first conditions are selected. In the first conditions, it is preferred to use $N_2$ gas as a nitrogen-containing gas and $Si_2H_6$ gas as a silicon-containing gas. From the viewpoint of forming a low-Si density silicon nitride film with a uniform thickness, the flow rate ratio between $N_2$ gas and $Si_2H_6$ gas ($N_2$ gas flow rate/$Si_2H_6$ gas flow rate) is preferably in the range of 1 to 5000, more preferably in the range of 100 to 2000. In particular, the $N_2$ gas flow rate is set in the range of 10 to 5000 mL/min (sccm), preferably in the range of 100 to 2000 mL/min (sccm), and the $Si_2H_6$ gas flow rate is set in the range of 0.5 to 100 mL/min (sccm), preferably in the range of 0.5 to 10 mL/min (sccm) such that the above-described gas flow rate ratio is met. In order to form a silicon nitride film having a low trap density under the first conditions which use $N_2$ gas and $Si_2H_6$ gas, the processing pressure preferably is 0.1 to 500 Pa, more preferably 1 to 100 Pa. Further, the power density of microwaves is preferably made to be in the range of 0.41 to 4.19 W/cm² (per unit area (cm²) of the plane antenna 31).

When forming a silicon nitride film e.g. having a high trap density (e.g. in the range of $1\times10^{11}$ to $1\times10^{13}$ $cm^{-2}$ $eV^{-1}$ in terms of surface density), second conditions are selected. In the second conditions, it is preferred to use $NH_3$ gas as a nitrogen-containing gas and $Si_2H_6$ gas as a silicon-containing gas. From the viewpoint of forming a high-Si density silicon nitride film with a uniform thickness, the flow rate ratio between $NH_3$ gas and $Si_2H_6$ gas ($NH_3$ gas flow rate/$Si_2H_6$ gas flow rate) is preferably in the range of 0.1 to 1000, more preferably in the range of 10 to 300. In particular, the $NH_3$ gas flow rate is set in the range of 10 to 5000 mL/min (sccm), preferably in the range of 100 to 2000 mL/min (sccm), and the $Si_2H_6$ gas flow rate is set in the range of 0.5 to 100 mL/min (sccm), preferably in the range of 1 to 50 mL/min (sccm) such that the above-described gas flow rate ratio is met. In order to form a silicon nitride film having a high trap density under the second conditions which use $NH_3$ gas and $Si_2H_6$ gas, the processing pressure preferably is 1 to 1333 Pa, more preferably 50 to 650 Pa. Further, the power density of microwaves is preferably made in the range of 0.41 to 4.19 W/cm² (per unit area (cm²) of the plane antenna 31).

By carrying out plasma CVD under the second conditions by means of the plasma processing apparatus 100, a silicon nitride film having an approximately uniform trap density distribution in the thickness direction of the film can be formed. For example, a silicon nitride film can be formed in which the volume density of traps at an energy position corresponding to the mid-gap of silicon is distributed in the range of $1\times10^{17}$ to $5\times10^{17}$ $cm^{-3}$ $eV^{-1}$ in the thickness direction of the film and, from the interface with an underlying silicon layer to the surface of the film, the volume density of traps is distributed in the range of $1\times10^{17}$ to $2\times10^{17}$ $cm^{-3}$ $eV^{-1}$. In this case, the thickness of the silicon nitride film formed is preferably in the range of 1 to 20 nm, more preferably in the range of 3 to 15 nm. The volume density of traps, by raising it to the two-thirds power, can be converted to the surface density.

In both the first conditions and the second conditions, the plasma CVD processing temperature, i.e. the temperature of the worktable 2, is preferably not less than 300° C. and not more than 800° C., more preferably 400 to 600° C. The gap (between the lower surface of the transmission plate 28 and the upper surface of the worktable 2) G In the plasma processing apparatus 100 is preferably set e.g. at about 50 to 500 mm from the viewpoint of forming a silicon nitride film with a uniform thickness and uniform quality.

Next, the supply of microwaves is stopped, thereby terminating the formation of a silicon nitride film (step S5). Next, the supply of the gases from the gas supply mechanism 18 is stopped (step S6). After the termination of deposition of the silicon nitride film, the wafer W with the silicon nitride film formed thereon is carried out of the chamber 1, whereby processing for the wafer W is completed (step S7).

In the formation of a silicon nitride film by plasma CVD using the plasma processing apparatus 100, the trap density of the silicon nitride film can be increased by depositing the silicon nitride film on a silicon dioxide film ($SiO_2$ film). In this embodiment, therefore, it is preferred to form a thin $SiO_2$ film in the surface of a base layer in advance when the base layer is a silicon substrate composed of monocrystalline silicon or a polycrystalline silicon layer. In this case, the thin $SiO_2$ film may be any of a native oxide film, a thermally oxidized film and a plasma oxidized film. It is also possible to form a chemically oxidized film by chemically treating a Si surface with a chemical having oxidizing properties, such as HPM (hydrochloric acid-hydrogen peroxide-water mixture) or SPM (sulfuric acid-hydrogen peroxide-water mixture). The thickness of such a thin $SiO_2$ film, to be formed in the surface of a base layer in advance, may preferably be 0.1 to 10 nm, more preferably 0.1 to 3 nm.

The trap density of a silicon nitride film formed by the silicon nitride film-forming method of this embodiment can be measured e.g. by utilizing PYS method (photoemission yield spectroscopy). YPS is a method which involves irradiating a sample (silicon nitride film) with a light having a certain energy, and measuring the total energy of photoelectrons, emitted by photoelectric effect, as a function of the energy of the incident light. The PYS measurement can determine, with high sensitivity and in a nondestructive manner, the distribution of defect level density in a silicon nitride film and at the interface between the silicon nitride film and a silicon layer. In this regard, the photoelectron yield measured by PYS corresponds to the energy integral of the distribution of electron occupation density. Accordingly, the distribution of defect level density can be determined from derivative PYS spectra by the method of S. Miyazaki (Microelectron. Eng. 48 (1999) 63).

A description will now be made of an experiment which was conducted to confirm the technical effects of the present invention. Using the plasma processing apparatus 100, various silicon nitride films were separately formed on a p-type silicon substrate (10 Ω·cm) under varying conditions. The resulting silicon nitride films were each measured by PYS. The PYS measurement was carried out by using an ultraviolet lamp, irradiating each silicon nitride film with ultraviolet light, and measuring emitted electrons with a photomultiplier. The experiment was conducted with respect to the test categories A to H shown in Table 1 below.

TABLE 1

| Test category | Plasma CVD conditions | Thickness of silicon nitride film | Pretreatment |
| --- | --- | --- | --- |
| Category A | Conditions 1 | 3 nm | DHF treatment |
| Category B | Conditions 1 | 3 nm | HPM treatment |
| Category C | Conditions 1 | 10 nm | DHF treatment |
| Category D | Conditions 1 | 10 nm | HPM treatment |
| Category E | Conditions 2 | 3 nm | DHF treatment |
| Category F | Conditions 2 | 3 nm | HPM treatment |

TABLE 1-continued

| Test category | Plasma CVD conditions | Thickness of silicon nitride film | Pretreatment |
| --- | --- | --- | --- |
| Category G | Conditions 2 | 10 nm | DHF treatment |
| Category H | Conditions 2 | 10 nm | HPM treatment |

The details of the CVD plasma conditions shown in Table 1 are as follows:
<Plasma CVD Conditions 1: $N_2/Si_2H_6$ Gas System>
$N_2$ gas flow rate: 1200 mL/min (sccm)
$Si_2H_6$ gas flow rate: 3 mL/min (sccm)
Flow rate ratio ($N_2/Si_2H_6$): 400
Processing pressure: 7.6 Pa
Temperature of worktable 2: 500° C.
Microwave power: 2000 W
Microwave power density: 1.67 W/cm$^2$ (per unit area (cm$^2$) of plane antenna 31)
<Plasma CVD Conditions 2: $NH_3/Si_2H_6$ Gas System>
$NH_3$ gas flow rate: 800 mL/min (sccm)
$Si_2H_6$ gas flow rate: 10 mL/min (sccm)
Flow rate ratio ($NH_3/Si_2H_6$): 80
Processing pressure: 126 Pa
Temperature of worktable 2: 500° C.
Microwave power: 2000 W
Microwave power density: 1.67 W/cm$^2$ (per unit area (cm$^2$) of plane antenna 31)

The details of the pretreatments shown in FIG. 1 are as follows:
<DHF Treatment>
Prior to plasma CVD, the surface of the silicon substrate was treated with a 1% dilute hydrofluoric acid solution to remove a native oxide film.
<HPM Treatment>
Prior to plasma CVD, the surface of the silicon substrate was first treated with a 1% dilute hydrofluoric acid solution to remove a native oxide film, and then treated with 10% HPM (hydrochloric acid-hydrogen peroxide-water mixture) to form a $SiO_2$ film which is a chemically oxidized film.

Figure 5:
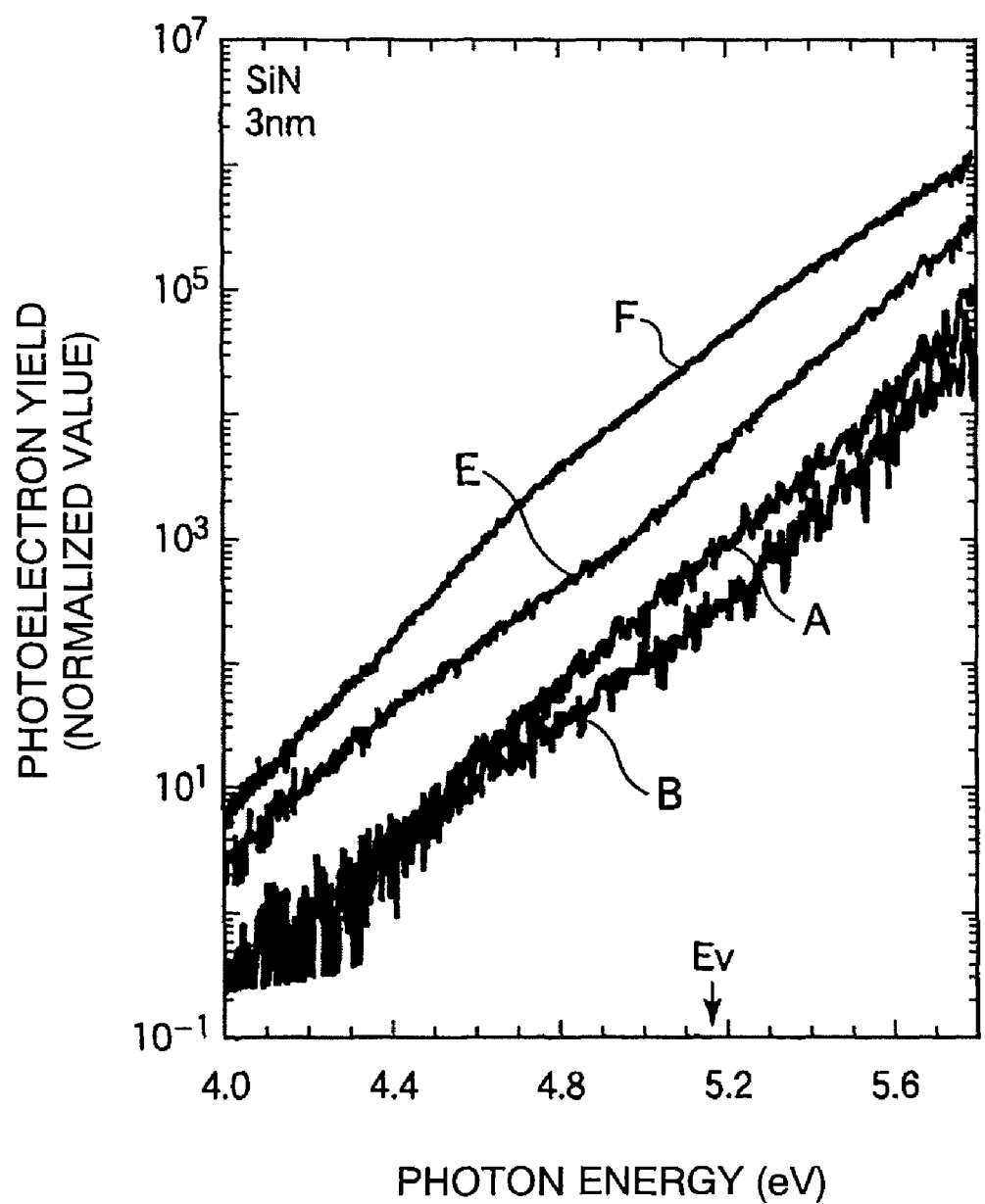
FIG. 5 is a diagram showing the results of PYS measurement for silicon nitride films (thickness 3 nm)
Figure 6:
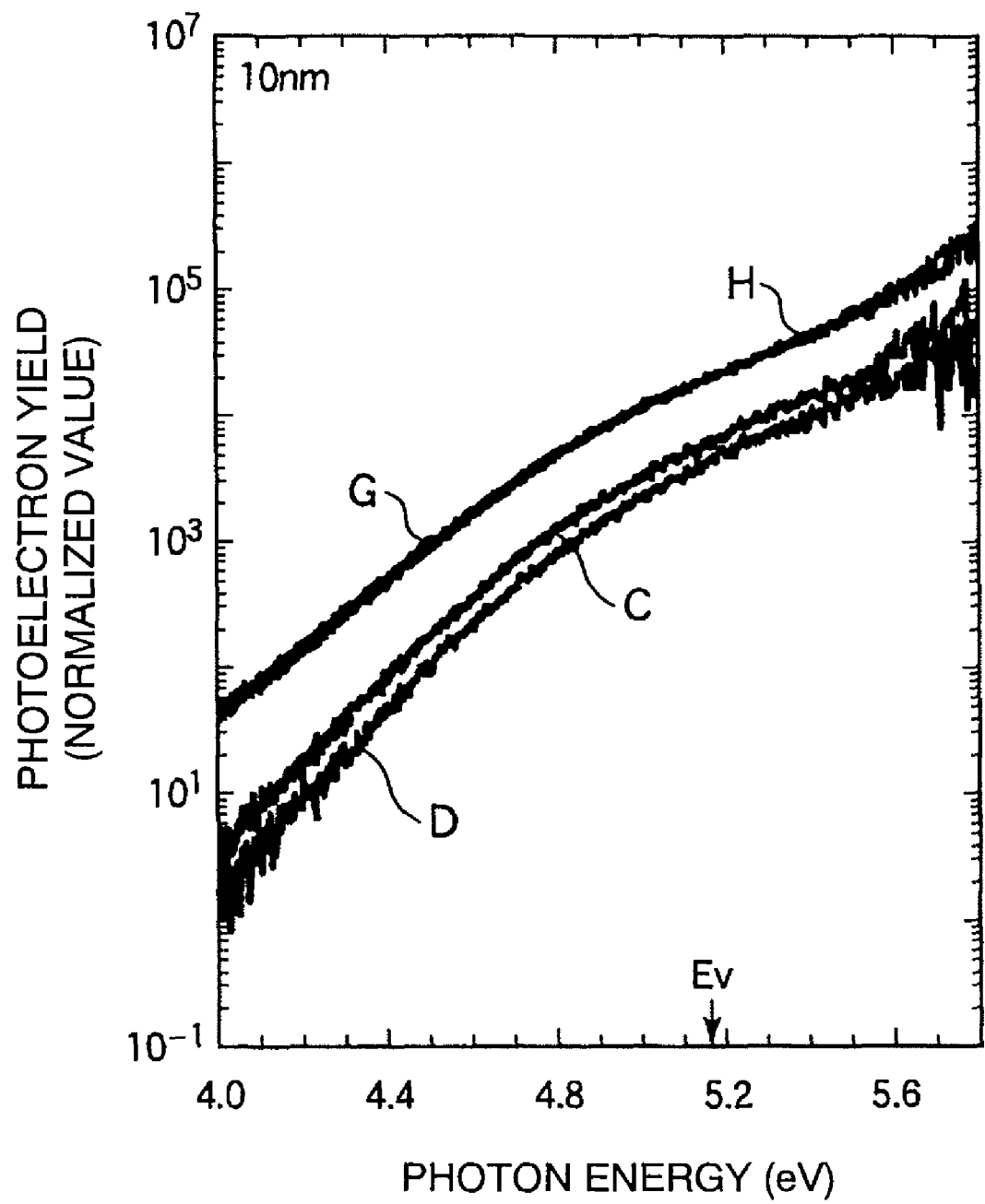
FIG. 6 is a diagram showing the results of PYS measurement for silicon nitride films (thickness 10 nm)

FIGS. 5 and 6 show the results of the PYS measurement. FIG. 5 shows the results for the silicon nitride films having a thickness of 3 nm, and FIG. 6 shows the results for the silicon nitride films having a thickness of 10 nm. Compared to the silicon nitride films formed under the plasma CVD conditions 1 using nitrogen as a source gas (test categories A, B, C, D), the silicon nitride films formed under the plasma CVD conditions 2 using ammonia as a source gas (test categories E, F, G, H) show a higher photoelectron yield, indicating a higher trap density.

The difference in the density of defect level due to the difference in the plasma CVD conditions is marked in the silicon nitride films having a thickness of 3 nm (test categories A, B, E, F) as compared to the silicon nitride films having a thickness of 10 nm (test categories C, D, G, H). Further, comparison of the data in FIG. 5 between categories E and F which both form the 3 nm-thick silicon nitride films under the same plasma CVD conditions, suggests that a silicon nitride film having a larger defect level density can be obtained by carrying out an HPM pretreatment to form a chemically oxidized $SiO_2$ layer on the surface of a silicon substrate in advance.

In another experiment, a chemical composition distribution and a defect level density distribution were determined and their correlation was examined for a silicon nitride film formed by plasma CVD using the plasma processing apparatus 100. A chemically oxidized $SiO_2$ layer was formed by HTP treatment on the Si(100) surface of a p-type silicon substrate (10 Ω·cm), and then a 11.4 nm-thick silicon nitride film was formed at a temperature of 400° C. The plasma CVD conditions are as follows:
<Plasma CVD Conditions 3: $NH_3/Si_2H_6$ Gas System>
$NH_3$ gas flow rate: 800 mL/min (sccm)
$Si_2H_6$ gas flow rate: 16 mL/min (sccm)
Flow rate ratio ($NH_3/Si_2H_6$): 50
Processing pressure: 126 Pa
Temperature of worktable 2: 400° C.
Microwave power: 2000 W
Microwave power density: 1.67 W/cm$^2$ (per unit area (cm$^2$) of plane antenna 31)

Figure 7:
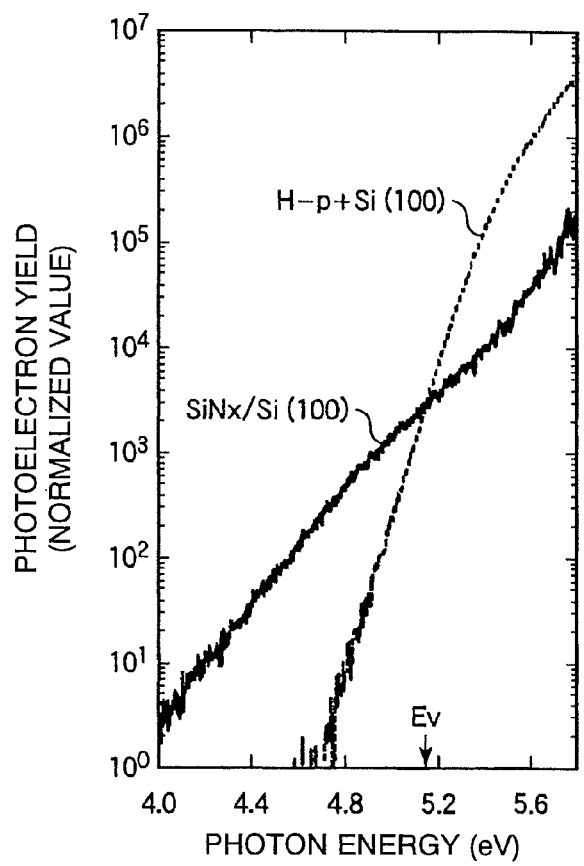
FIG. 7 is a diagram showing the results of PYS measurement for a silicon nitride film and a hydrogen-terminated Si(100) surface.

The silicon nitride film formed was etched with dilute hydrofluoric acid to make the film thinner, and PYS measurement and X-ray photoemission spectroscopy (XPS) measurement were carried out in the course of etching. FIG. 7 shows the results of PYS measurement for the prepared silicon nitride film [$SiN_x$/Si(100)] and the hydrogen-terminated Si(100)[H−p+Si(100)] surface after 60-second etching. The data in FIG. 7 indicates that because of the presence of electron occupation defects (traps) in an energy region corresponding to the Si band gap in the silicon nitride film [$SiN_x$/Si(100)], the photoelectron yield from the silicon nitride film is significantly higher as compared to the hydrogen-terminated Si(100) surface in a lower energy region (<5.15 eV) than the upper end (Ev) of the Si valence band.

Figure 8:
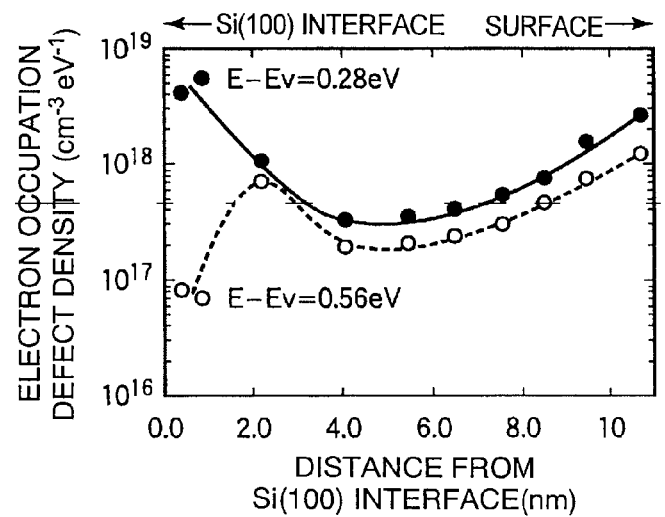
FIG. 8 is a diagram showing the depth direction distribution of the electron occupation defect density of a silicon nitride film.

FIG. 8 shows the depth direction distribution of the electron occupation defect density, estimated from the change in the photoelectron yield in the course of etching. As indicated in FIG. 8, the electron occupation defect density at an energy position shallower by 0.28 eV than the upper end (Ev) of the Si valence band (E−Ev=0.28 eV), the electron occupation defect density is at a maximum (6.0×10$^{18}$ cm$^{-3}$ eV$^{-1}$) in the vicinity of the Si substrate interface and at a minimum (3.2×10$^{17}$ cm$^{-3}$ eV$^{-1}$) at a position of about 4 nm from the Si substrate interface. At an energy position corresponding to the mid-gap of silicon (E−Ev=0.56 eV), the electron occupation defect density significantly decreases in the vicinity of the Si substrate interface, while the distribution of the electron occupation defect density, which is similar to that of the valence band side, was obtained in the silicon nitride film.

Figure 9:
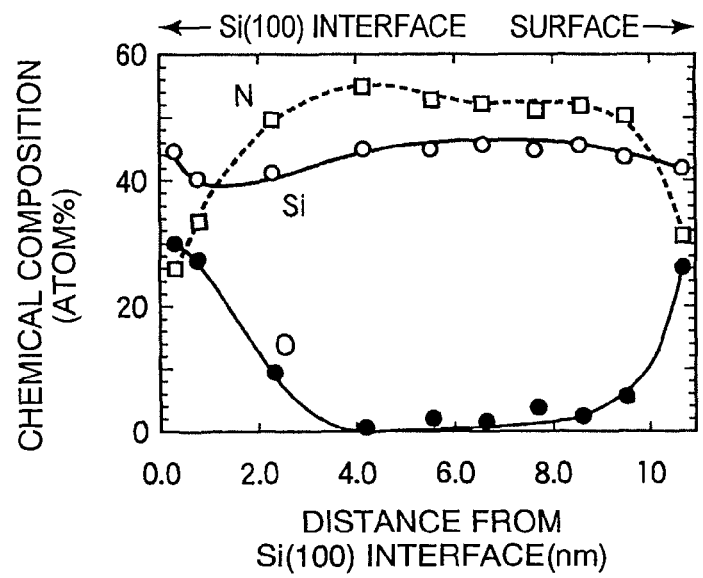
FIG. 9 is a diagram showing the chemical composition profile of a silicon nitride film, determined by XPS analysis.

FIG. 9 shows the chemical composition profile of the silicon nitride film, determined by XPS analysis. As can be seen from FIG. 9, appreciable diffusion and mixing of oxygen atoms into the silicon nitride film is observed in a region in the vicinity of the surface of the silicon nitride film and in a region within about 3 nm in the thickness direction from the Si substrate interface. The oxidation on the surface side is considered to be due to native oxidation, while the oxidation on the Si substrate interface side is considered to be due to interfacial reaction between the chemically oxidized $SiO_2$ layer and the silicon nitride film.

As can be seen from comparison of the data in FIG. 8 for the energy position corresponding to the mid-gap of silicon (E−Ev=0.56 eV) with the XPS-determined chemical composition profile of the silicon nitride film, shown in FIG. 9, the region from the Si substrate interface to about 2 nm in the thickness direction, in which the electron occupation defect increases locally, corresponds to the vicinity of the interface between the chemically oxidized $SiO_2$ layer and the silicon nitride film. The results obtained thus indicate that in the silicon nitride film formed under the plasma CVD conditions 3, using the plasma processing apparatus 100, the electron occupation defect density in the film significantly increases in that vicinity of the interface between the chemically oxidized SiO$_2$ layer and the silicon nitride film into which oxygen atoms are diffused and mixed.

Figure 10:
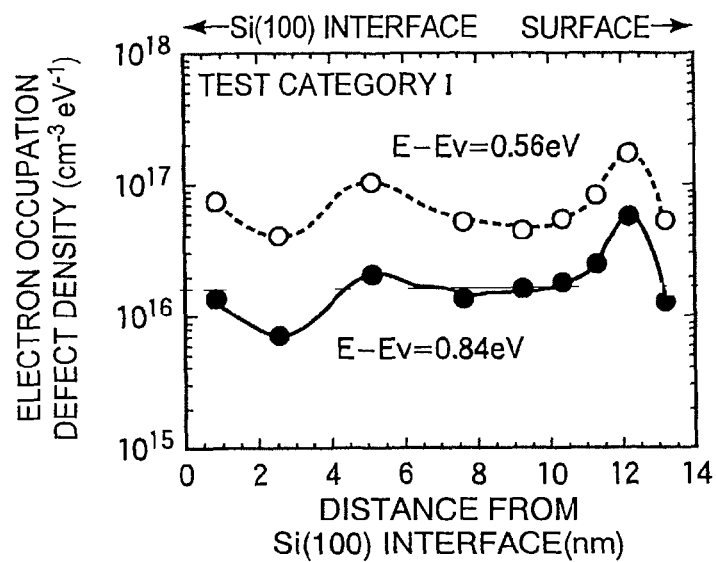
FIG. 10 is a diagram showing the depth direction distribution of the electron occupation defect density of the silicon nitride film of test category I, formed by LPCVD.
Figure 11:
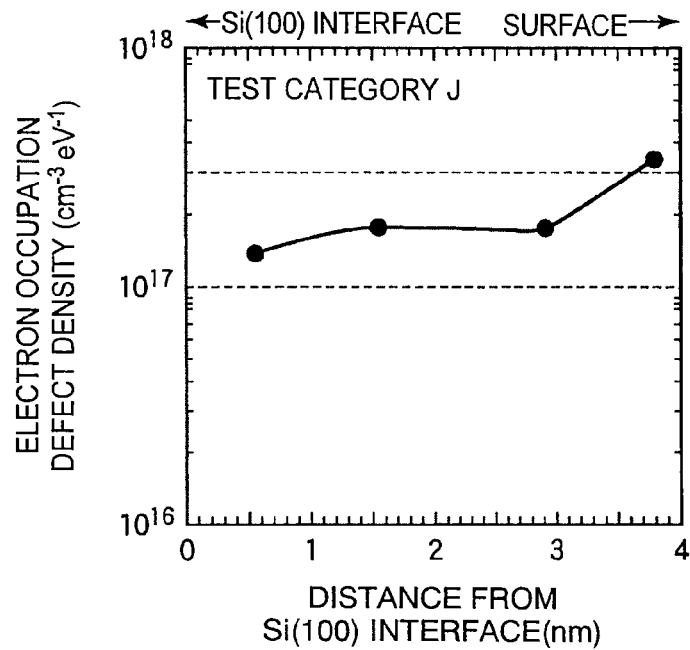
FIG. 11 is a diagram showing the depth direction distribution of the electron occupation defect density of the silicon nitride film of test category J.
Figure 12:
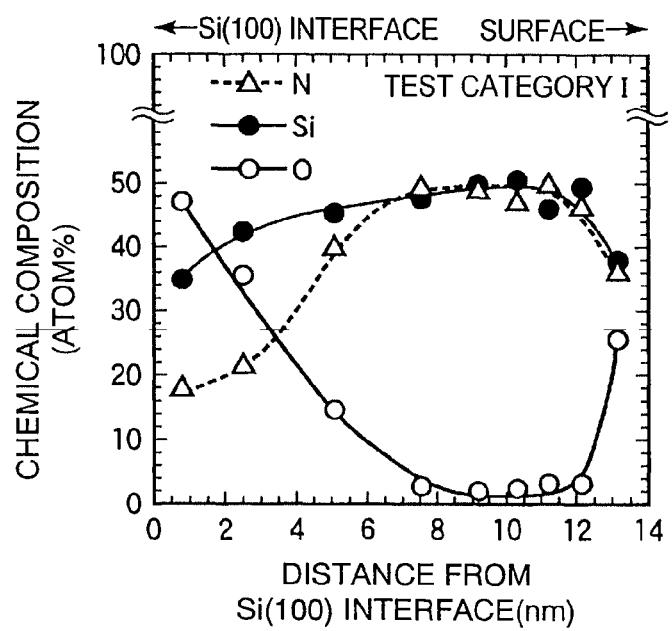
FIG. 12 is a diagram showing the results of XPS analysis of the silicon nitride film of test category I, formed by LPCVD.
Figure 13:
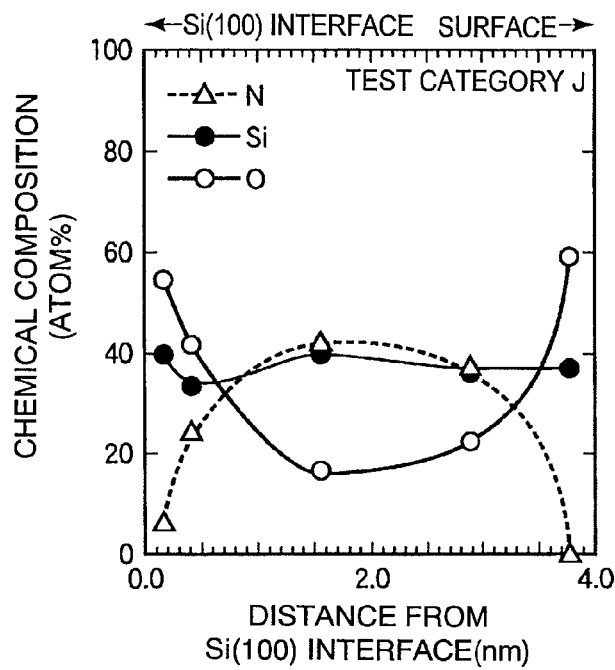
FIG. 13 is a diagram showing the results of XPS analysis of the silicon nitride film of test category J.

FIGS. 10 and 11 show the results of measurement of the depth direction distribution of electron occupation defect density at an energy position corresponding to the mid-gap of silicon, as determined for two types of silicon nitride films (test categories I and J) formed under different conditions. FIGS. 12 and 13 show the results of XPS measurement of the chemical composition profiles of the silicon nitride films of test categories I and J. The test category I (comparative example) relates to a 13 nm-thick silicon nitride film formed by LPCVD (low pressure chemical vapor deposition) carried out under the below-described conditions, while the category I relates to a 4.1 nm-thick silicon nitride film formed by plasma CVD using the plasma processing apparatus 100, carried out under the above-described plasma CVD conditions 2. In both the test categories I and J, CVD was carried out after forming a 3 nm-thick chemically oxidized SiO$_2$ film by HPM treatment carried out in the above-described manner.

<LPCVD Conditions>
SiH$_2$Cl$_2$ gas flow rate: 10 mL/min (sccm)
NH$_3$ gas flow rate: 1000 mL/min (sccm)
Flow rate ratio (NH$_3$/SiH$_2$Cl$_2$): 100
Processing pressure: 133 Pa
Temperature of worktable 2: 800° C.

FIG. 10 shows the volume density of the electron occupation defect of the silicon nitride film of the test category I (comparative example), formed by LPCVD, at an energy position corresponding to the mid-gap of silicon (E−Ev=0.56 eV) and at an energy position shallower by 0.28 eV than the upper end (Ev) of the Si valence band (E−Ev=0.28 eV). As can be seen from FIG. 10, in the case of the silicon nitride film of test category I formed by LPCVD, the electron occupation defect density at the energy position corresponding to the mid-gap of silicon (E−Ev=0.56 eV) is generally not more than $1 \times 10^{17}$ cm$^{-3}$ eV$^{-1}$ in the region within about 10 nm from the Si(100) interface in the thickness direction. Thus, the silicon nitride film of test category 1 has a low electron occupation defect density as a whole. There is, therefore, a fear of easy escape of charges.

On the other hand, in the case of the silicon nitride film of the test category J within the scope of the present invention, formed under the plasma CVD conditions 2 using ammonia and disilane as source gases, an approximately uniform distribution of electron occupation defect in the film thickness direction with a larger absolute value compared to the test category J was confirmed as indicated in FIG. 11. More specifically, in the silicon nitride film of test category J, the electron occupation defect density at an energy position corresponding to the mid-gap of silicon is approximately uniformly distributed in the range of $1 \times 10^{17}$ to $5 \times 10^{17}$ cm$^{-3}$ eV$^{-1}$ in the thickness direction of the film. In the silicon nitride film of test category J, having such a uniform trap density of large absolute value in the thickness direction of the film, injected charges are held even in the central portion of the film. The silicon nitride film, in which escape of charges is thus hard to occur, is therefore considered to have a high charge storage capacity. Such a silicon nitride film, having a controlled uniform electron occupation defect in the thickness direction of the film, can therefore be expected to exert the excellent charge storage capacity when used as a charge storage layer of a semiconductor memory device having a SONOS (MONOS) structure.

Further, as shown in FIG. 11, the silicon nitride film of test category J has a thickness of 4 nm and, in the region of 1 nm to 3 nm from the Si substrate interface in the thickness direction, i.e. in the region except the region in the vicinity of the interface and the surface region which is subject to oxidation, the electron occupation defect density at an energy position corresponding to the mid-gap of silicon is distributed in the narrow range of $1 \times 10^{17}$ to $2 \times 10^{17}$ cm$^{-3}$ eV$^{-1}$. A portion having a very uniform trap density distribution can thus be formed in the silicon nitride film and, therefore, the silicon nitride film, despite the small thickness, can exert a sufficiently high charge storage capacity. The use of such a silicon nitride film, having a uniform electron occupation defect in the thickness direction of the film, can therefore fully meet the demand for reliable finer semiconductor memory devices. Such a silicon nitride film having a uniform trap density distribution in the thickness direction of the film can exert good charge storage capacity in the thickness range of 1 to 20 nm.

As can be seen from the chemical composition profile shown in FIG. 12, in the silicon nitride film of test category I (comparative example), the oxygen concentration in the film is high in the vicinity of the Si(100) interface and in the vicinity of the surface, whereas oxygen is little present around the center of the film. On the other hand, as can be seen from the chemical composition profile shown in FIG. 13, in the silicon nitride film of test category J, oxygen is present at a concentration of about 20 atom % even around the center of the film.

From comparison between the data of FIGS. 10 to 13 in terms of the distribution of oxygen in the respective silicon nitride film, it turns out that while the electron occupation defect density increases in those regions in which oxygen is present, the electron occupation defect density does not increase in proportion to an increase in the concentration of oxygen but plateaus even when oxygen is present e.g. at a concentration exceeding 20 atom %. It is therefore inferred that the production of electron occupation defects in a silicon nitride film is associated with dangling bonds produced in the silicon nitride film in the course of substitution reaction of trivalent nitrogen atom by divalent oxygen atom.

As described above, the silicon nitride film formed by plasma CVD using the plasma processing apparatus 100, carried out under the selected conditions, is a film in which the electron occupation defect density is controlled with high precision and which has a uniform trap density distribution in the thickness direction of the film.

Figure 14:
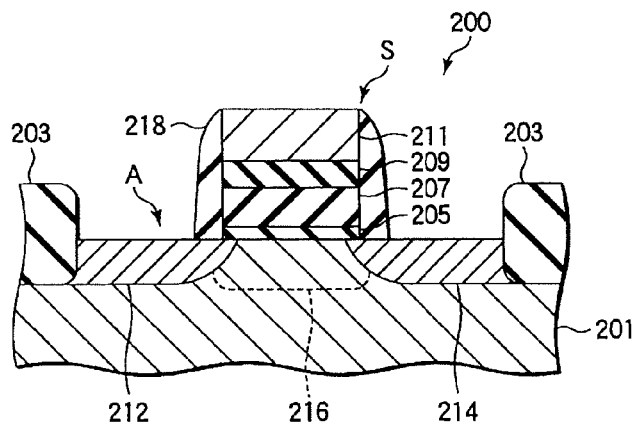
FIG. 14 is a cross-sectional diagram schematically illustrating the construction of a nonvolatile semiconductor memory device according to an embodiment of the present invention.

A description will now be made of an embodiment in which the silicon nitride film-forming method of this embodiment is applied to the manufacturing of a semiconductor device, taking an n channel-type nonvolatile semiconductor memory device as an example of the semiconductor device. FIG. 14 is a diagram illustrating the cross-sectional structure of a nonvolatile semiconductor memory device 200 according to an embodiment of the present invention. FIGS. 15 through 20 are cross-sectional diagrams illustrating a process for the manufacturing of a nonvolatile semiconductor memory device, according to this embodiment.

As shown in FIG. 14, the nonvolatile semiconductor memory device 200 has a device structure S composed of a tunnel oxide film 205, a silicon nitride film 207, a silicon oxide film 209 and an electrode 211, formed in this order on e.g. a p-type silicon substrate (Si substrate) 201.

The tunnel oxide film 205 is comprised, for example, of an SiO$_2$ film or SiON film having a thickness of about 0.1 to 10 nm. The silicon nitride film 207 functions as a charge storage layer and is comprised, for example, of an SiN film or SiON film having a thickness of about 1 to 50 nm. It is also possible to provide two or more layers of silicon nitride films as a charge storage layer. The silicon oxide film 209 is an SiO$_2$ film formed, for example, by CVD and functions as a block layer (barrier layer) between the electrode 211 and the silicon nitride film 207. The silicon oxide film 209 has a thickness of e.g. about 1 to 50 nm. The electrode 211 is comprised, for example, of a polycrystalline silicon film formed by CVD and functions as a control gate (CG) electrode. The electrode 211 may also be a film comprising a metal such as tungsten, titanium, tantalum, copper, aluminum or gold. The electrode 211 has a thickness of e.g. about 0.1 to 50 nm. The electrode 211 is not limited to a single-layer electrode but, for the purpose of lowering the resistivity of the electrode 211 and speeding up the device, may be of a laminate structure comprising, for example, tungsten, molybdenum, tantalum, titanium, a silicide or nitride thereof, or an alloy thereof. The electrode 211 is connected to a not-shown interconnect layer.

The nonvolatile semiconductor memory device 200 may also be formed in a p well or a p-type silicon layer in a semiconductor substrate.

A device separation film 203 is formed in the surface of the Si substrate 201, and an active region A in which the nonvolatile semiconductor memory device 200 is formed is defined by the device separation film 203. A source region 212 and a drain region 214 are formed around the device structure S in the Si substrate 201. The portion sandwiched between the source region 212 and the drain region 214 in the active region A is the channel region 216 of the nonvolatile semiconductor memory device 200. Side walls 218 are formed on both sides of the device structure S.

The operation of the nonvolatile semiconductor memory device 200 having the above structure will now be described. At the time of data writing, the source region 212 and the drain region 214 are held at 0 V with the electric potential of the Si substrate 201 as a reference, and a predetermined positive voltage is applied to the electrode 211. Then electrons are stored in the channel region 216 and an inversion layer is formed, and the electrons in the inversion layer partly move through the tunnel oxide film 205 to the silicon nitride film 207 by the tunnel effect. The electrons which have moved to the silicon nitride film 207 are captured in traps which are formed in the silicon nitride film 207 and serve as a charge capture center, whereby data is stored.

At the time of data reading, one of the source region 212 and the drain region 214 is held at 0 V with the electric potential of the Si substrate 201 as a reference, and a predetermined voltage is applied to the other. A predetermined voltage is applied also to the electrode 211. By the voltage application, the channel current and the drain voltage change depending on the presence or absence of electrons stored in the silicon nitride film 207 and the amount of stored electrons. Accordingly, stored data can be read out by detecting the change in the channel current or the drain voltage.

At the time of data erasing, both the source region 212 and the drain region 214 are held at 0 V with the electric potential of the Si substrate 201 as a reference, and a predetermined negative voltage is applied to the electrode 211. By the voltage application, electrons stored in the silicon nitride film 207 are drawn through the tunnel oxide film 205 into the channel region 216, whereby the nonvolatile semiconductor memory device 200 is returned to the erased state with a small amount of electrons stored in the silicon nitride film 207.

Figure 15:
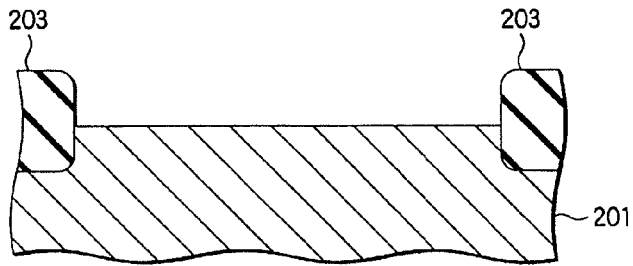
FIG. 15 is a cross-sectional diagram illustrating a process step in the manufacturing of a nonvolatile semiconductor memory device, carried out using the silicon nitride film-forming method according to the first embodiment of the present invention.

When manufacturing the nonvolatile semiconductor memory device 200, the device separation film 203 is first formed on the Si substrate 201 by a method such as LOCOS (local oxidation of silicon) or STI (shallow trench isolation), as shown in FIG. 15. Further, impurity doping may be carried out by a method such as ion implantation in order to adjust the threshold voltage of the nonvolatile semiconductor memory device 200.

Figure 16:
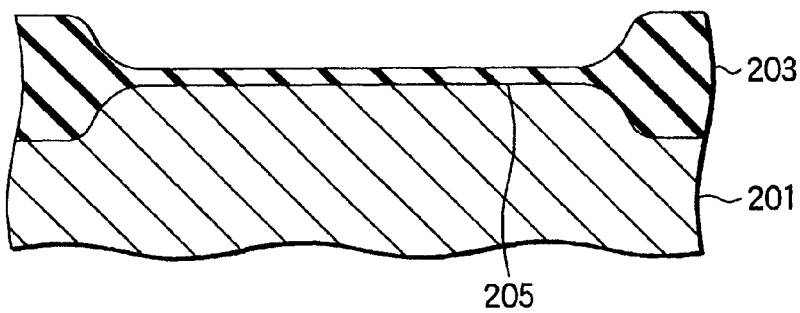
FIG. 16 is a cross-sectional diagram illustrating a process step in the manufacturing of a nonvolatile semiconductor memory device, carried out using the silicon nitride film-forming method according to the first embodiment of the present invention.

Next, a silicon oxide film is formed e.g. by a thermal oxidation method on the surface of the active region A of the Si substrate 201, thereby forming the tunnel oxide film 205 as shown in FIG. 16. If necessary, the surface of the silicon oxide film may be subjected to nitriding treatment to form a silicon oxynitride film (SiON film).

Figure 17:
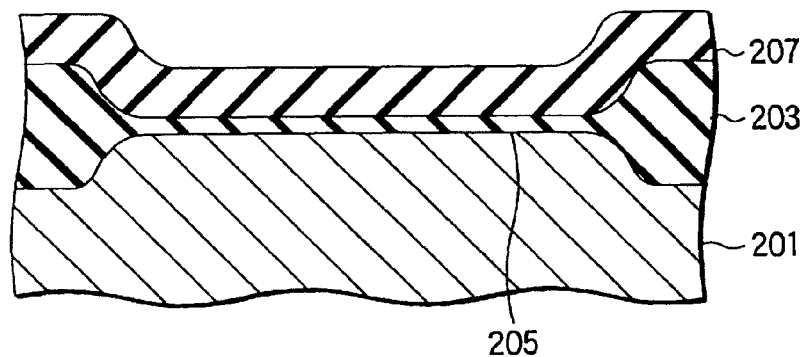
FIG. 17 is a cross-sectional diagram illustrating a process step in the manufacturing of a nonvolatile semiconductor memory device, carried out using the silicon nitride film-forming method according to the first embodiment of the present invention.

Next, as shown in FIG. 17, the silicon nitride film 207 as a charge storage layer is formed on the tunnel oxide film 205 by plasma CVD. By forming the silicon nitride film 207 under predetermined plasma CVD conditions as described above, using the plasma processing apparatus 100 shown in FIG. 1, the trap density of the film can be controlled in a desired range.

Figure 18:
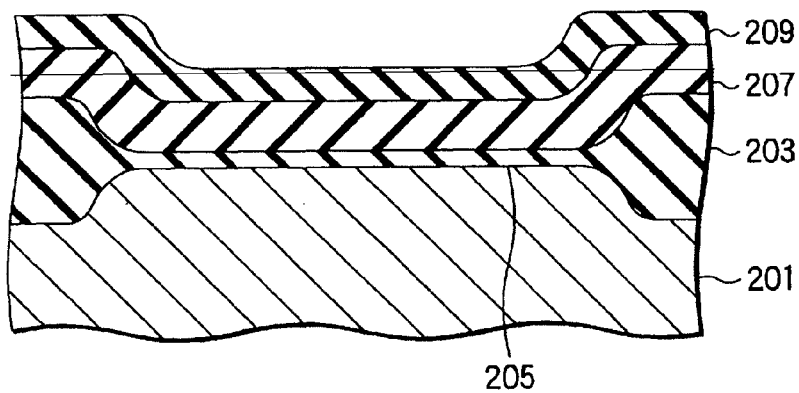
FIG. 18 is a cross-sectional diagram illustrating a process step in the manufacturing of a nonvolatile semiconductor memory device, carried out using the silicon nitride film-forming method according to the first embodiment of the present invention.
Figure 19:
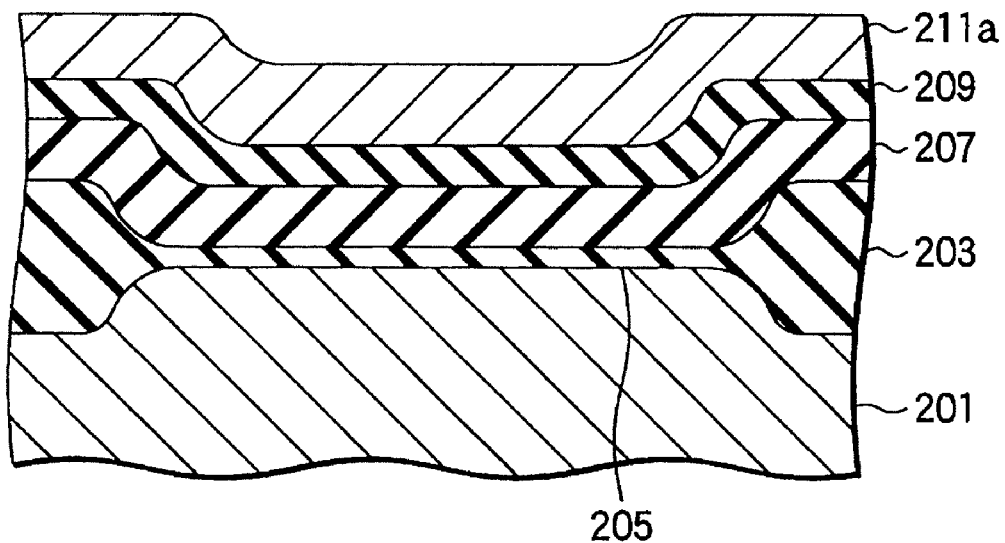
FIG. 19 is a cross-sectional diagram illustrating a process step in the manufacturing of a nonvolatile semiconductor memory device, carried out using the silicon nitride film-forming method according to the first embodiment of the present invention.

Next, as shown in FIG. 18, the silicon oxide film 209 is formed on the silicon nitride film 207. The silicon oxide film 209 can be formed by e.g. thermal oxidation or CVD. Further, as shown in FIG. 19, a polysilicon layer, a metal layer or a metal silicide layer, for example, is deposited on the silicon oxide film 209 to form an electrode film 211a. The electrode film 211a can be formed e.g. by CVD using a silane gas as a raw material.

Figure 20:
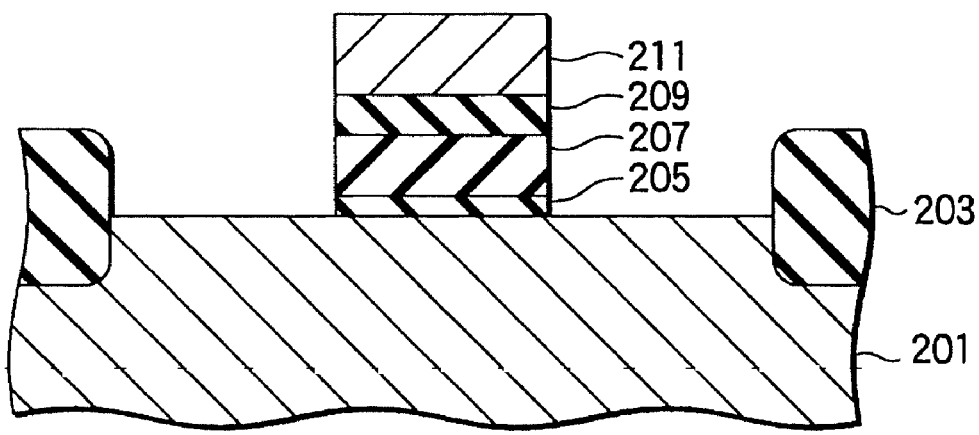
FIG. 20 is a cross-sectional diagram illustrating a process step in the manufacturing of a nonvolatile semiconductor memory device, carried out using the silicon nitride film-forming method according to the first embodiment of the present invention.

Next, the electrode film 211a, the silicon oxide film 209, the silicon nitride film 207 and the tunnel oxide film 205 are subjected to etching by using the photolithography technique with a patterned resist as a mask, thereby obtaining a patterned laminate structure of the electrode 211, the silicon oxide film 209 and the silicon nitride film 207 as shown in FIG. 20.

Next, an n-type impurity is ion-implanted at a low concentration in the silicon surface of the active region A via the tunnel oxide film 205, thereby forming an impurity region (n channel). Further, the side walls 218 are formed. Thereafter, the source region 212 and the drain region 214 are formed by ion-implanting an n-type impurity at a high concentration in the silicon of the active region A. The nonvolatile semiconductor memory device 200 having the structure shown in FIG. 14 can be manufactured in this manner.

While the manufacturing of the n channel-type nonvolatile semiconductor memory device 200 has been described by way of example, a p channel-type nonvolatile semiconductor memory device can be manufactured by reversing the impurity conductivity type.

As described hereinabove, according to this embodiment, by forming a silicon nitride film under selected plasma CVD conditions, using the plasma processing apparatus 100, the trap density of the silicon nitride film can be controlled with high precision so as to obtain a desired trap density distribution, for example, a uniform trap density in the thickness direction of the film. In addition, a silicon nitride film, formed by the silicon nitride film-forming method according to this embodiment, has excellent properties as an insulating film for use in the manufacturing of a variety of semiconductor devices, and is especially suited as a charge storage layer of a nonvolatile semiconductor memory device.

[Second Embodiment]

Figure 21:
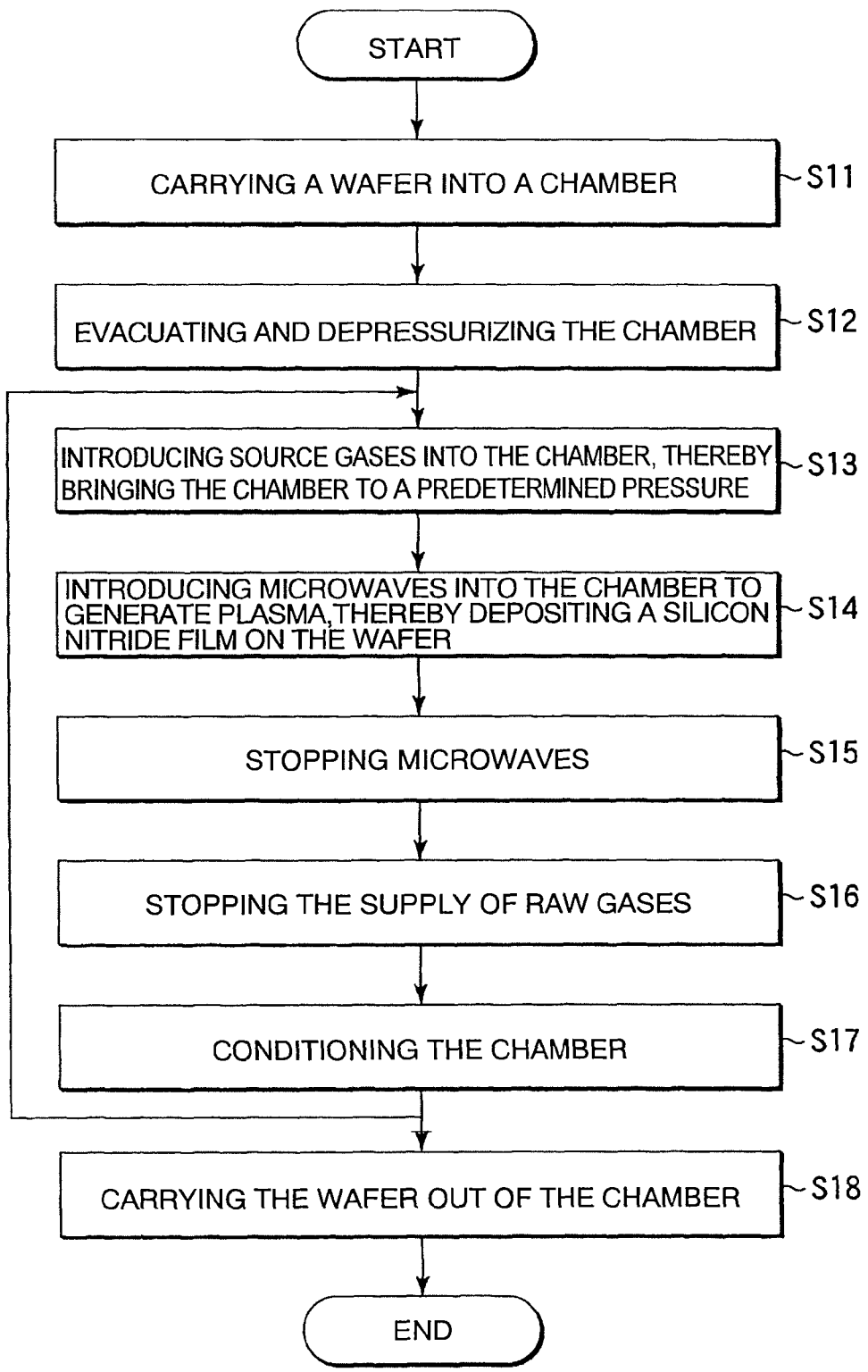
FIG. 21 is a flow chart illustrating a process of a silicon nitride film-forming method according to a second embodiment of the present invention.
Figure 22:
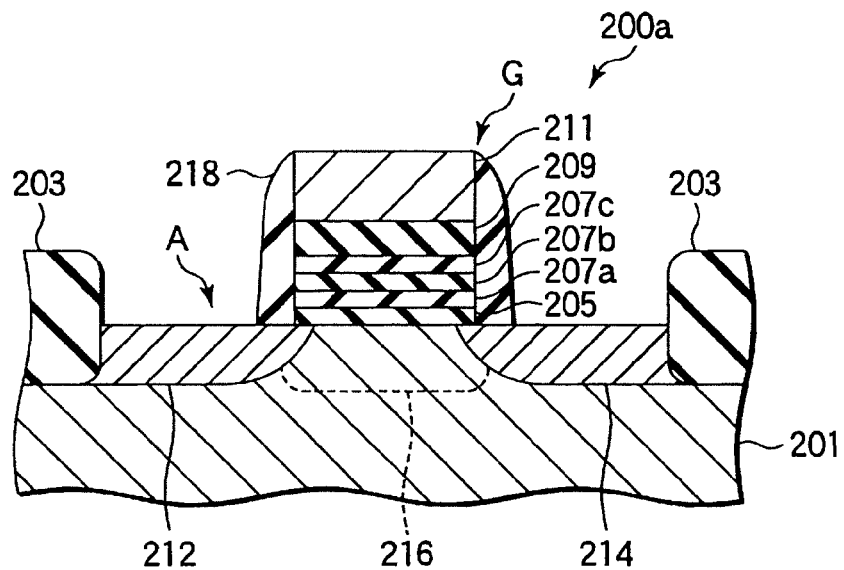
FIG. 22 is a diagram schematically illustrating the construction of a nonvolatile semiconductor memory device according to another embodiment of the present invention.

A second embodiment of the present invention will now be described with reference to FIGS. 21 and 22. FIG. 21 illustrates an exemplary process of a silicon nitride film-forming method according to the second embodiment of the present invention. The silicon nitride film-forming method of this embodiment is characterized in that a laminate of two or more layers of silicon nitride films, having different levels of trap densities, is formed by carrying out the film formation with varying plasma CVD conditions, using the plasma processing apparatus 100.

First, as shown in FIG. 21, the gate valve 17 of the plasma processing apparatus 100 is opened, and a wafer W is carried from the transfer port 16 into the chamber 1 of the plasma processing apparatus 100 and placed on the worktable 2 (step S11). Next, the exhaust device 24 is actuated to evacuate and depressurize the chamber 1 (step S12). While evacuating and depressurizing the chamber 1, a nitrogen-containing gas and a silicon-containing gas are introduced from the nitrogen-containing gas supply source 19*a* and the silicon-containing gas supply source 19*b* of the gas supply mechanism 18 into the chamber 1 respectively at a predetermined flow rate (step S13). In this manner the pressure in the chamber 1 is adjusted to a predetermined pressure.

Next, microwaves generated in the microwave generator 39, having a predetermined frequency, for example 2.45 GHz, are radiated from the plane antenna 31 into the space above the wafer W in the chamber 1 to generate a plasma (step S14). Dissociation of the source gases progresses in the plasma and, by reaction of active species such as $Si_pH_q$, $SiH_q$, $NH_q$, N, etc., a thin film of silicon nitride $Si_xN_y$ is deposited on the wafer W. In the steps S13 and S14, plasma CVD is carried out under predetermined conditions (conditions as described above with reference to the first embodiment) of gas species, pressure, microwave power, etc.

Next, the supply of microwaves is stopped, thereby terminating the formation of a silicon nitride film (step S15). Next, the supply of the gases form the gas supply mechanism 18 is stopped (step S16). Thereafter, a purge gas, such as nitrogen gas, is introduced into the chamber 1 for a predetermined time to condition the chamber 1 (S17). The S17 conditioning step is not essential.

In the silicon nitride film-forming method according to this embodiment, after step S16 (or step S15), the formation of a silicon nitride film is again carried out under different plasma CVD conditions (conditions as described above with reference to the first embodiment). In particular, after the completion of the process step S17 (or step S16), the process is returned to step 13: film-forming source gases are introduced into the chamber 1 until the pressure in the chamber 1 is adjusted to a predetermined pressure. Plasma CVD is then carried out by the process from step S14 to step S17 (or step S16). The second film-forming process is carried out under different conditions from those of the first film-forming process, i.e. using, for example, a different type of source gas, a changed set pressure, etc. Consequently, a laminate of silicon nitride films, having different trap densities from each other, can be formed by the first film-forming process and the second film-forming process. Further, by out the different film-forming processes alternately, a plurality of silicon nitride films having different trap densities can be deposited alternately.

In this embodiment the process from step S13 to step S17 (or step S16) can be repeated three or more times if necessary. By thus repeating the film-forming processes under different plasma CVD conditions, silicon nitride films having different trap densities can be deposited sequentially. Upon completion of all the film-forming processes, the wafer W with the silicon nitride films formed thereon is carried out of the chamber 1 in step S18, whereby processing for the wafer W is completed.

In this embodiment, the trap densities of a silicon nitride film formed by each film-forming process can be controlled by selecting plasma CVD conditions in the same manner as in the first embodiment. Thus, when forming a silicon nitride film having a high trap density or when forming a silicon nitride film having a low trap density, the respective film-forming processes can be carried out under the same plasma CVD conditions as described above with reference to the first embodiment.

In this embodiment, two or more layers of silicon nitride films formed in the above-described manner can be used e.g. as a charge storage layer of a nonvolatile semiconductor memory device. More specifically, according to the silicon nitride film-forming method of this embodiment, a nonvolatile semiconductor memory device 200*a*, having a laminate structure of a first silicon nitride film 207*a* having a low trap density, a second silicon nitride film 207*b* having a high trap density and a third silicon nitride film 207*c* having a low trap density as shown in FIG. 22, can be manufactured. The other configuration of the nonvolatile semiconductor memory device 200*a* shown in FIG. 22 is the same as the nonvolatile semiconductor memory device 200 shown in FIG. 14, and hence the same elements are given the same reference numerals and a description thereof will be omitted. Though the nonvolatile semiconductor memory device 200*a* shown in FIG. 22 has a three-layer structure of the silicon nitride films: the first silicon nitride film 207*a*; the second silicon nitride film 207*b*; and the third silicon nitride film 207*c*, as a charge storage layer, it is also possible to form a charge storage layer having a laminate structure of four or more layers of silicon nitride films by repeating plasma CVD film-forming processes.

As described hereinabove, according to the silicon nitride film-forming method of this embodiment, a laminate of silicon nitride films having different trap densities can be formed. This enables wide band engineering in nonvolatile semiconductor memory devices, making it possible to manufacture a nonvolatile semiconductor memory device having an excellent data storage capacity. In addition, two or more layers of silicon nitride films having different trap densities can be formed in the chamber 1 of the single plasma processing apparatus 100 without exposure of the films to the air. This enables designing of an efficient process.

The other configuration, operation and technical effects of this embodiment are the same as the first embodiment.

[Third Embodiment]

In the above-described second embodiment a plurality of silicon nitride films with varying trap densities are formed. Instead of varying trap densities, it is also possible to form silicon nitride films with varying silicon concentrations. In the silicon nitride film-forming method of a third embodiment, a silicon nitride film having a high Si concentration and a silicon nitride film having a low Si concentration are formed alternately under varying plasma CVD conditions, using the plasma CVD processing apparatus 100. The process steps of the second embodiment, shown in the flow chart of FIG. 21, entirely apply to this embodiment.

Figure 23:
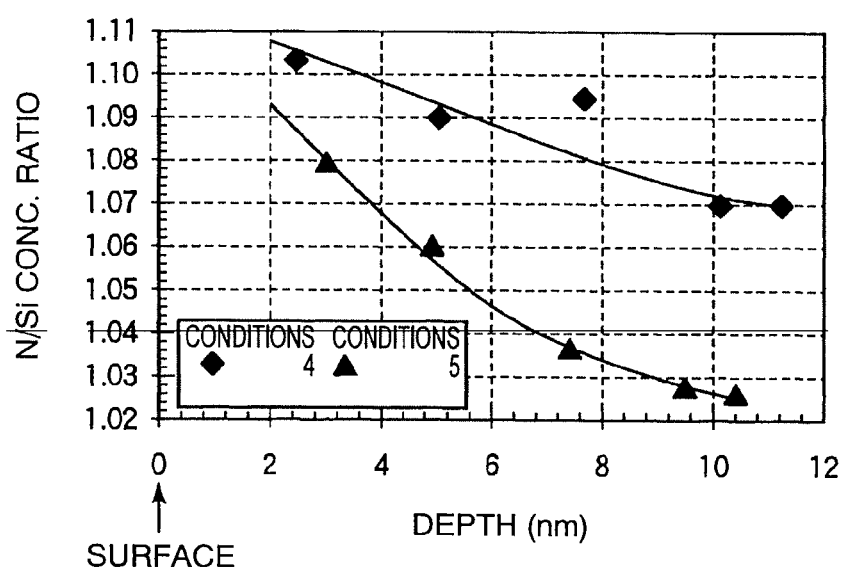
FIG. 23 is a diagram showing the results of XPS analysis of silicon nitride films.

FIG. 23 shows the results of XPS analysis of silicon nitride films formed by plasma CVD using the plasma processing apparatus 100. The abscissa of FIG. 23 denotes the depth of the respective silicon nitride film, measured by an ellipsometer, and the ordinate denotes the ratio between the N concentration and the Si concentration (N conc/Si conc) in the respective silicon nitride film. The plasma CVD conditions in this experiment are as follows:

<Plasma CVD Conditions 4: Low Si Conc. Conditions>
$NH_3$ gas flow rate: 800 mL/min (sccm)
$Si_2H_6$ gas flow rate: 10 mL/min (sccm)
Processing pressure: 126 Pa
Temperature of worktable 2: 500° C.
Microwave power: 2000 W
Microwave power density: 1.67 W/cm$^2$ (per unit area (cm$^2$) of plane antenna 31)

<Plasma CVD Conditions 5: High Si Conc. Conditions>
$NH_3$ gas flow rate: 800 mL/min (sccm)
$Si_2H_6$ gas flow rate: 16 mL/min (sccm)

Processing pressure: 300 Pa
Temperature of worktable 2: 500° C.
Microwave power: 2000 W
Microwave power density: 1.67 W/cm$^2$ (per unit area (cm$^2$) of plane antenna 31)

As can be seen from FIG. 23, compared to the silicon nitride film formed under the plasma CVD conditions 4, the silicon nitride film formed under the plasma CVD conditions 5 has a relatively small ratio between the N concentration and the Si concentration (N conc/Si conc) in the film, i.e. a relatively high Si concentration. By thus using varying plasma CVD conditions in forming silicon nitride films using the plasma processing apparatus 100, the Si concentration of each film can be controlled at a desired value.

When forming a silicon nitride film having a high Si concentration (e.g. in the range of 30 to 80 atom %, preferably in the range of 40 to 70 atom %), plasma CVD can be carried out under the following conditions: With reference to source gases, NH$_3$ gas may be used as a nitrogen-containing gas and Si$_2$H$_6$ gas may be used as a silicon-containing gas. The NH$_3$ gas flow rate is set in the range of 10 to 5000 mL/min (sccm), preferably in the range of 100 to 1000 mL/min (sccm), and the Si$_2$H$_6$ gas flow rate is set in the range of 1 to 100 mL/min (sccm), preferably in the range of 5 to 20 mL/min (sccm). From the viewpoint of forming a high-Si density silicon nitride film with a uniform thickness, the flow rate ratio between NH$_3$ gas and Si$_2$H$_6$ gas (NH$_3$ gas flow rate/Si$_2$H$_6$ gas flow rate) is preferably in the range of 0.1 to 1000, more preferably in the range of 10 to 300. The processing pressure preferably is 1 to 1333 Pa, more preferably 50 to 650 Pa.

When forming a silicon nitride film having a low Si concentration (e.g. in the range of 10 to 50 atom %, preferably in the range of 10 to 45 atom %), the type of source gas, the flow rate, the flow rate ratio, etc. of the above-described conditions for forming a high-Si concentration silicon nitride may be adjusted.

In both of the above cases, the plasma CVD processing temperature, i.e. the temperature of the worktable 2, is preferably not less than 300° C., more preferably 400 to 600° C. The gap (between the lower surface of the transmission plate 28 and the upper surface of the worktable 2) G in the plasma processing apparatus 100 is preferably set e.g. at about 50 to 500 mm from the viewpoint of forming a silicon nitride film with a uniform thickness and good quality.

In the silicon nitride film-forming method of this embodiment, a laminate of silicon nitride films having different Si concentrations can be formed by repeating silicon nitride film-forming processes with varying plasma CVD conditions (see FIG. 21). The two or more layers of silicon nitride films thus formed can be used e.g. as a charge storage layer of a nonvolatile semiconductor memory device. Taking the nonvolatile semiconductor memory device 200a shown in FIG. 22, described above with reference to the second embodiment, as an example, the nonvolatile semiconductor memory device 200a, having as a charge storage layer a laminate structure of a first silicon nitride film 207a having a low Si concentration, a second silicon nitride film 207b having a high Si concentration and a third silicon nitride film 207c having a low Si concentration, can be manufactured. It is, of course, possible to form a charge storage layer having a laminate structure of four or more layers of silicon nitride films by repeating plasma CVD film-forming processes.

As described hereinabove, according to the silicon nitride film-forming method of this embodiment, a laminate of silicon nitride films having different Si concentrations can be formed. This enables wide band engineering in nonvolatile semiconductor memory devices, making it possible to manufacture a nonvolatile semiconductor memory device having an excellent data storage capacity. In addition, two or more layers of silicon nitride films having different Si concentrations can be formed in the chamber 1 of the single plasma processing apparatus 100 without exposure of the films to the air. This enables designing of an efficient process.

The other construction, operation and technical effects of this embodiment are the same as the first and second embodiments.

The present invention is not limited to the embodiments described above, but various modifications may be made thereto. For example, though in the embodiments the silicon nitride film-forming method of the present invention is applied to the formation of a charge storage layer of a nonvolatile semiconductor memory device to enhance the charge storage capacity, it is applicable not only in the manufacturing of a nonvolatile semiconductor memory device but in the manufacturing of a variety of other semiconductor devices as well.

When manufacturing a semiconductor device such as a nonvolatile semiconductor memory device, a plurality of film-forming apparatuses, including the plasma processing apparatus 100, may be connected in vacuum without exposure to the air, so that intended films can be formed sequentially through the film-forming apparatuses.

The invention claimed is:

1. A method for forming a silicon nitride film of [SiN$_x$/Si (100)] on a substrate by plasma CVD, said method comprising:
    setting a substrate in a processing chamber;
    supplying a source gas containing a nitrogen-containing compound and a silicon-containing compound into the processing chamber, while introducing microwaves into the processing chamber by using a plane antenna having a plurality of holes, to form a plasma; and
    depositing the silicon nitride film on the substrate while controlling the plasma so that electron occupation defects (traps) will be present in an energy region corresponding to the Si band gap in the film in a trap density controlled at a predetermined value, the traps making photoelectron yield from the silicon nitride film significantly higher as compared to a hydrogen-terminated silicon surface in a lower energy region than an upper end (Ev) of the Si valence band, wherein
    the processing temperature upon the deposition of the silicon nitride film by plasma CVD is in the range of 300° C. to 600° C., and
    the trap density of the silicon nitride film is made to be distributed in the range of $1\times10^{17}$ to $5\times10^{17}$ cm$^{-3}$ eV$^{-1}$ in the thickness direction of the film.

2. The method for forming a silicon nitride film according to claim 1, wherein the silicon nitride film is formed by using ammonia (NH$_3$) as the nitrogen-containing compound and disilane (Si$_2$H$_6$) as the silicon-containing compound, and carrying out plasma CVD under such conditions as to generate the plasma at a processing pressure in the range of 1 Pa to 1333 Pa.

3. The method for forming a silicon nitride film according to claim 2, wherein the flow rate ratio between the ammonia (NH$_3$) and the disilane (Si$_2$H$_6$) (NH$_3$ flow rate/ Si$_2$H$_6$ flow rate) in the source gas is in the range of 0.1 to 1000.

4. The method for forming a silicon nitride film according to claim 1, wherein the thickness of the silicon nitride film is in the range of 1 to 20 nm.

5. The method for forming a silicon nitride film according to claim 1, wherein the silicon nitride film is formed by using nitrogen (N$_2$) as the nitrogen-containing compound and disilane ($Si_2H_6$) as the silicon-containing compound, and carrying out plasma CVD under such conditions as to generate the plasma at a processing pressure in the range of 0.1 Pa to 500 Pa.

6. The method for forming a silicon nitride film according to claim 5, wherein the flow rate ratio between the nitrogen ($N_2$) and the disilane ($Si_2H_6$)($N_2$ flow rate/ $Si_2H_6$ flow rate) in the source gas is in the range of 0.1 to 5000.

7. The method for forming a silicon nitride film according to claim 1, in which the step of depositing the silicon nitride film on the substrate further comprises:
   depositing a first silicon nitride film having a first trap density on the surface of the substrate by plasma CVD under first conditions; and
   depositing a second silicon nitride film having a second trap density, which differs from the first trap density, on the first silicon nitride film by plasma CVD under second conditions which differ from the first conditions.

8. The method for forming a silicon nitride film according to claim 7, wherein the first silicon nitride film is formed by using ammonia ($NH_3$) as the nitrogen-containing compound and disilane ($Si_2H_6$) as the silicon-containing compound, and generating the plasma at a processing pressure in the range of 1 Pa to 1333 Pa, and the second silicon nitride film is formed by using nitrogen ($N_2$) as the nitrogen-containing compound, and disilane ($Si_2H_6$) as the silicon-containing compound, and generating the plasma at a processing pressure in the range of 0.1 Pa to 500 Pa.

9. The method for forming a silicon nitride film according to claim 7, wherein the trap density of at least one of the first silicon nitride film and the second silicon nitride film is made to be distributed in the range of $1\times10^{17}$ to $5\times10^{17}$ $cm^{-3}$ $eV^{-1}$ in the thickness direction of the film.

10. The method for forming a silicon nitride film according to claim 9, wherein the thickness of at least one of the first silicon nitride film and the second silicon nitride film is in the range of 1 to 20 nm.

11. The method for forming a silicon nitride film according to claim 7, wherein the deposition of the first silicon nitride film and the deposition of the second silicon nitride film are carried out alternately.

12. A method for manufacturing a nonvolatile semiconductor memory device, comprising: forming a laminate of a plurality of insulating films, including a silicon nitride film of [$SiN_x$/Si(100)] as a charge storage layer having a charge storage capacity, on a channel region of a semiconductor substrate; and forming a gate electrode on the laminate, wherein the silicon nitride film is formed by a method for forming a silicon nitride film by depositing the silicon nitride film on the substrate by plasma CVD, said method comprising:
   setting the substrate in a processing chamber;
   supplying a source gas containing a nitrogen-containing compound and a silicon-containing compound into the processing chamber, while introducing microwaves into the processing chamber by using a plane antenna having a plurality of holes, to form a plasma; and
   depositing the silicon nitride film on the substrate while controlling the plasma so that electron occupation defects (traps) will be present in an energy region corresponding to the Si band gap in the film in a trap density controlled at a predetermined value, the traps making photoelectron yield from the silicon nitride film significantly higher as compared to a hydrogen-terminated silicon surface in a lower energy region than an upper end (Ev) of the Si valence band, wherein
   the processing temperature upon the deposition of the silicon nitride film by plasma CVD is in the range of 300° C. to 600° C., and
   the trap density of the silicon nitride film is made to be distributed in the range of $1\times10^{17}$ to $5\times10^{17}$ $cm^{-3}$ $eV^{-1}$ in the thickness direction of the film.

13. A nonvolatile semiconductor memory device comprising: a semiconductor substrate having a channel region in the main surface; a laminate of a plurality of insulating films, including a silicon nitride film of [$SiN_x$/Si(100)] as a charge storage layer having a charge storage capacity, formed on the channel region; and a gate electrode formed on the laminate, wherein the silicon nitride film is formed by a method for forming the silicon nitride film by depositing the silicon nitride film on the substrate by plasma CVD, said method comprising:
   setting the substrate in a processing chamber of a plasma processing apparatus;
   supplying a source gas containing a nitrogen-containing compound and a silicon-containing compound into the processing chamber, while introducing microwaves into the processing chamber by using a plane antenna having a plurality of holes, to form a plasma; and
   depositing the silicon nitride film on the substrate while controlling the plasma so that electron occupation defects (traps) will be present in an energy region corresponding to the Si band gap in the film in a trap density controlled at a predetermined value, the traps making photoelectron yield from the silicon nitride film significantly higher as compared to a hydrogen-terminated silicon surface in a lower energy region than an upper end (Ev) of the Si valence band, wherein
   the processing temperature upon the deposition of the silicon nitride film by plasma CVD is in the range of 300° C. to 600° C., and
   the trap density of the silicon nitride film is made to be distributed in the range of $1\times10^{17}$ to $5\times10^{17}$ $cm^{-3}$ $eV^{-1}$ in the thickness direction of the film.

14. A plasma processing apparatus comprising:
   a processing chamber for processing an object to be processed by using a plasma;
   a plane antenna, having a plurality of holes, through which microwaves are introduced into the processing chamber;
   a gas supply mechanism for supplying a source gas into the processing chamber;
   an exhaust mechanism for evacuating and depressurizing the processing chamber;
   a temperature adjustment mechanism for adjusting the temperature of the object to be processed; and
   a control section which carries out a method for forming a silicon nitride film of [$SiN_x$/Si(100)] by depositing a silicon nitride film on a substrate by plasma CVD, said method comprising:
   setting a substrate in a processing chamber of a plasma processing apparatus;
   supplying a source gas containing a nitrogen-containing compound and a silicon-containing compound into the chamber, while introducing microwaves into the processing chamber by using a plane antenna having a plurality of holes, to form a plasma; and
   depositing the silicon nitride film on the substrate while controlling the plasma so that electron occupation defects (traps) will be present in an energy region corresponding to the Si band gap in the film in a trap density controlled at a predetermined value, the traps making photoelectron yield from the silicon nitride film significantly higher as compared to a hydrogen-terminated silicon surface in a lower energy region than an upper end (Ev) of the Si valence band, wherein the processing temperature upon the deposition of the silicon nitride film by plasma CVD is in the range of 300° C. to 600° C., and the trap density of the silicon nitride film is made to be distributed in the range of $1 \times 10^{17}$ to $5 \times 10^{17}$ cm$^{-3}$ eV$^{-1}$ in the thickness direction of the film.

* * * * *